United States Patent
Lee

(10) Patent No.: US 11,862,550 B2
(45) Date of Patent: Jan. 2, 2024

(54) ELECTRONIC PACKAGE STRUCTURE AND METHOD OF MANUFACTURING THE SAME

(71) Applicant: Advanced Semiconductor Engineering, Inc., Kaohsiung (TW)

(72) Inventor: Yu-Ying Lee, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 17/491,220

(22) Filed: Sep. 30, 2021

(65) Prior Publication Data

US 2023/0096703 A1    Mar. 30, 2023

(51) Int. Cl.
*H01L 23/498* (2006.01)
*H01L 23/00* (2006.01)
*H01L 23/60* (2006.01)

(52) U.S. Cl.
CPC .. *H01L 23/49838* (2013.01); *H01L 23/49822* (2013.01); *H01L 23/60* (2013.01); *H01L 24/16* (2013.01); *H01L 2224/16227* (2013.01)

(58) Field of Classification Search
None
See application file for complete search history.

(56) References Cited

U.S. PATENT DOCUMENTS

| 9,236,356 | B2 | 1/2016 | Yang et al. |
| 9,848,496 | B2 | 12/2017 | Nakao |
| 2016/0163756 | A1 | 6/2016 | Wakiyama et al. |
| 2016/0276288 | A1* | 9/2016 | Lee .................. H01L 24/97 |
| 2017/0236786 | A1* | 8/2017 | Suzuki ............ H01L 23/49811 |
| | | | 257/659 |

FOREIGN PATENT DOCUMENTS

CN    102244068 B    7/2015

* cited by examiner

*Primary Examiner* — Long Pham
(74) *Attorney, Agent, or Firm* — FOLEY & LARDNER LLP

(57) ABSTRACT

An electronic package structure and a method of manufacturing an electronic package structure are provided. The electronic package structure includes a substrate, a conductive element, and a support structure. The substrate has a bottom surface and a lateral surface angled with the bottom surface. The conductive element is on the lateral surface of the substrate. The support structure is on the bottom surface of the substrate and configured to space the bottom surface from an external carrier. A lateral surface of the support structure is spaced apart from the lateral surface of the substrate by a first distance.

12 Claims, 23 Drawing Sheets

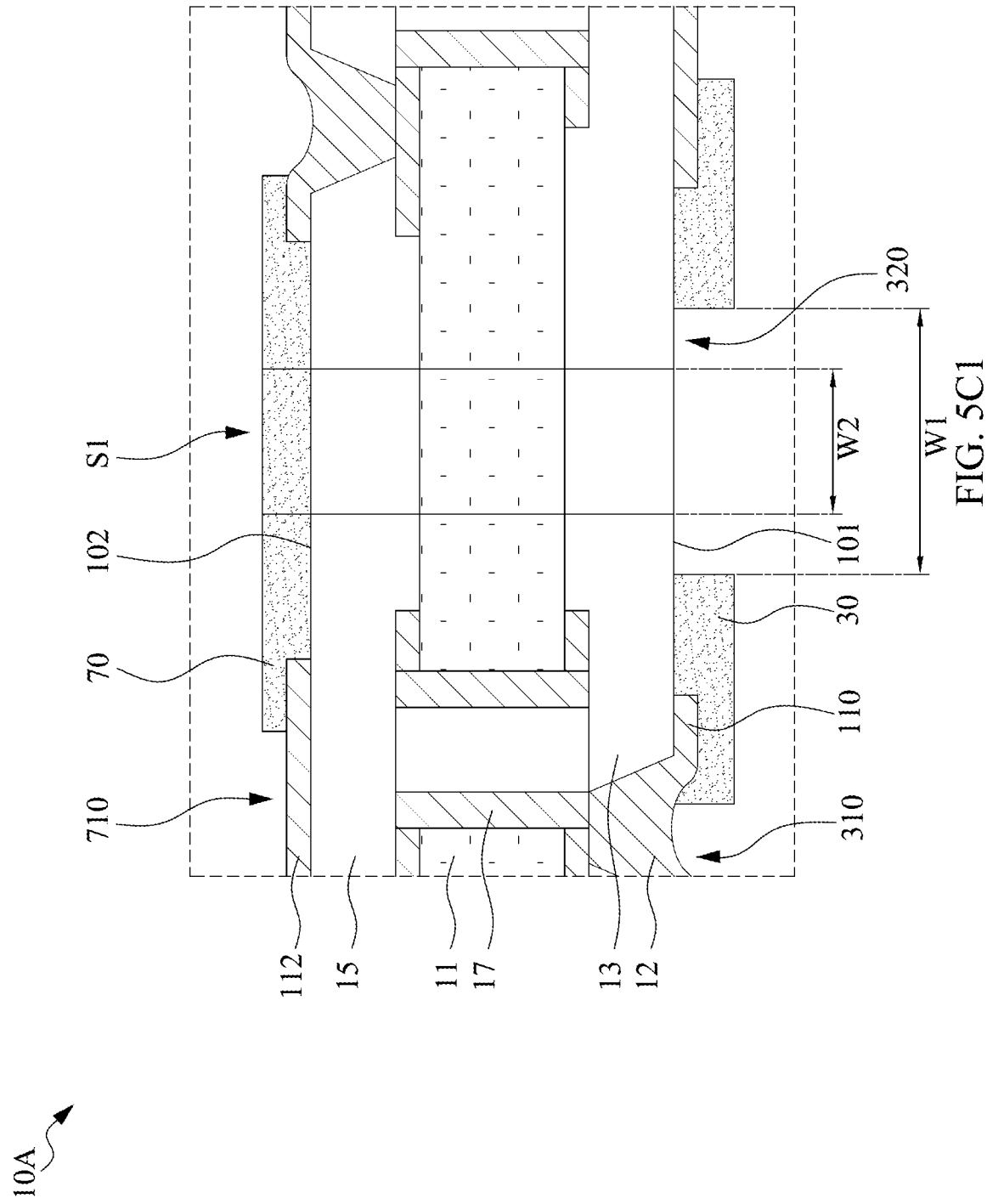

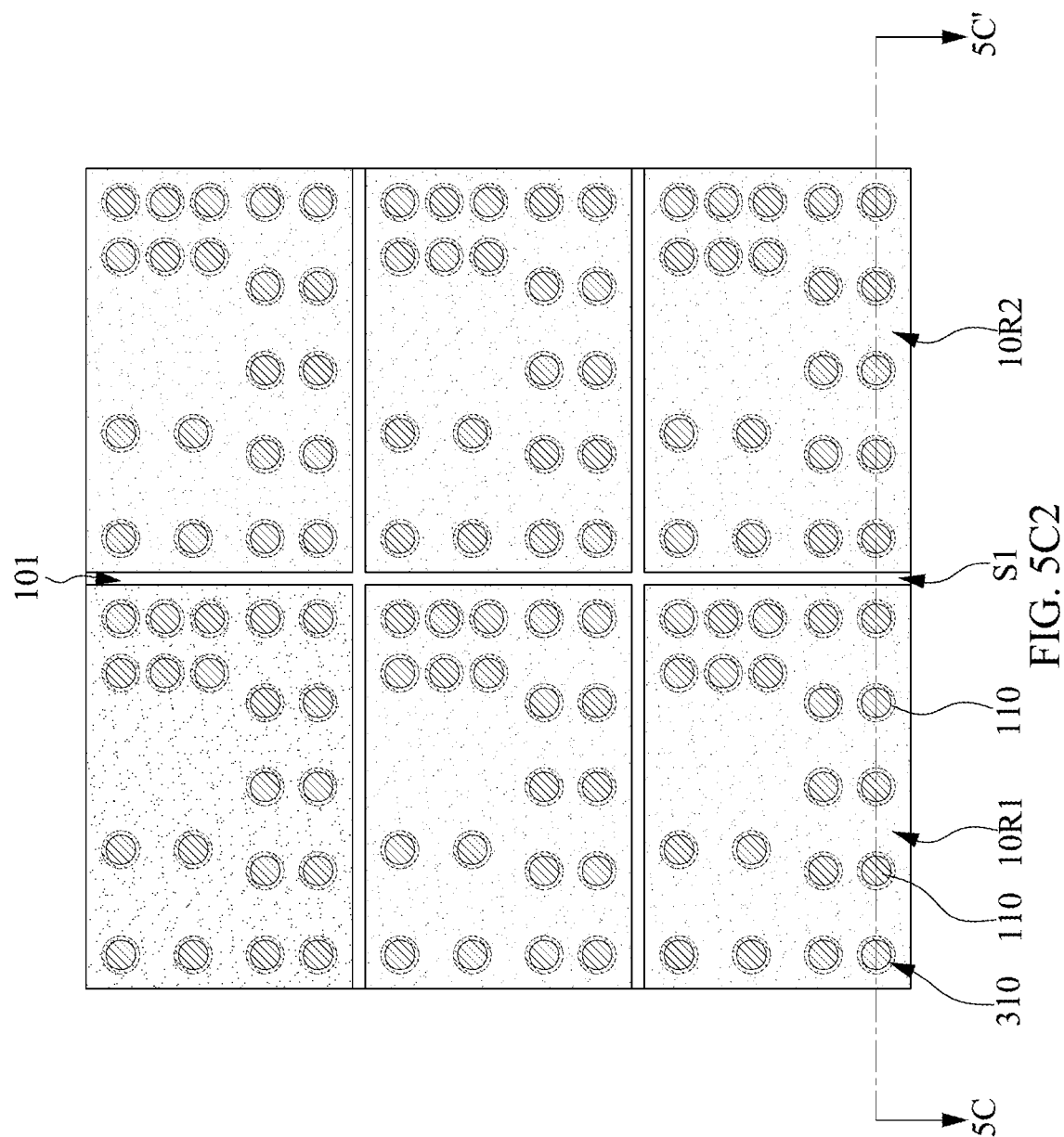
FIG. 5C2

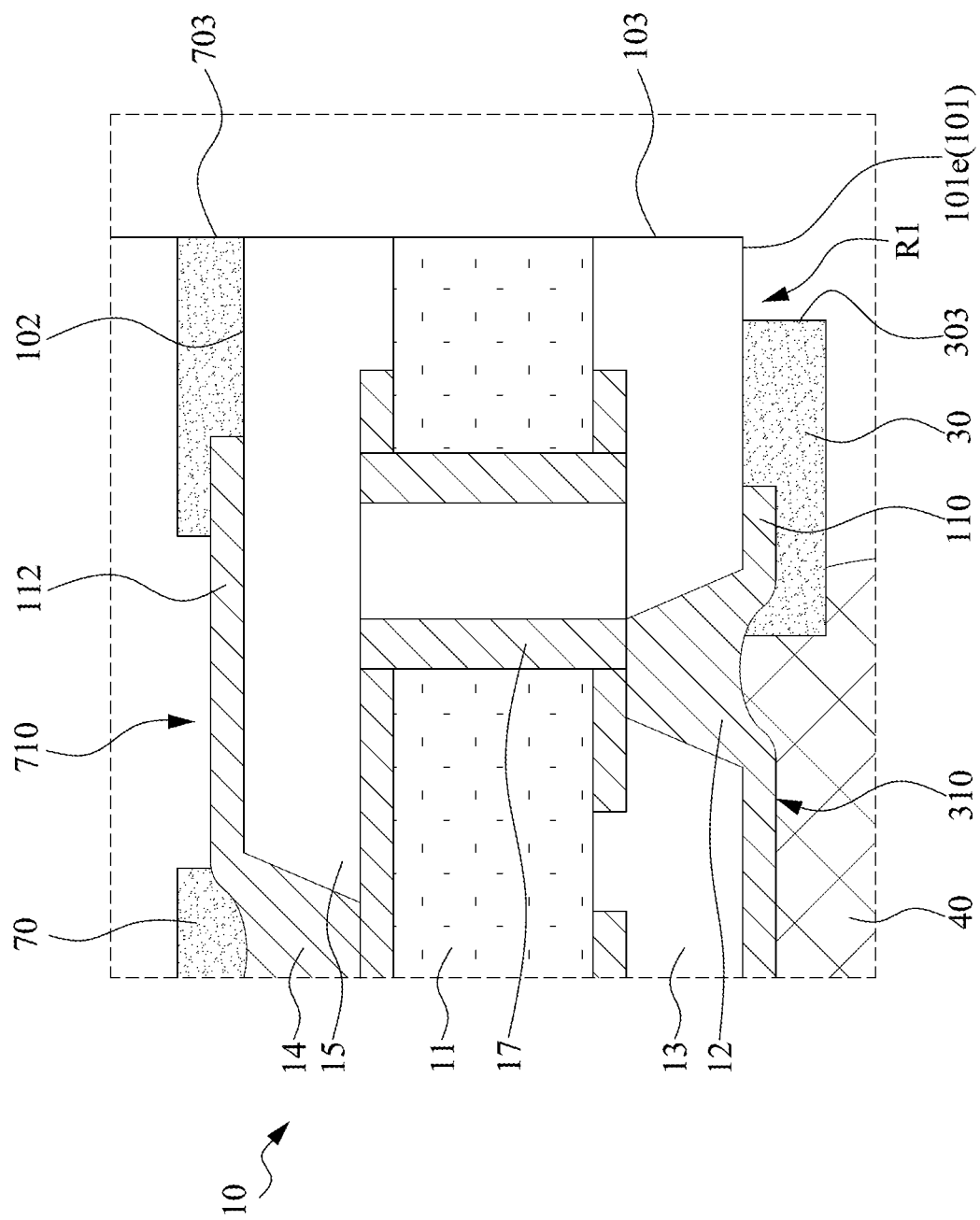
FIG. 5D1

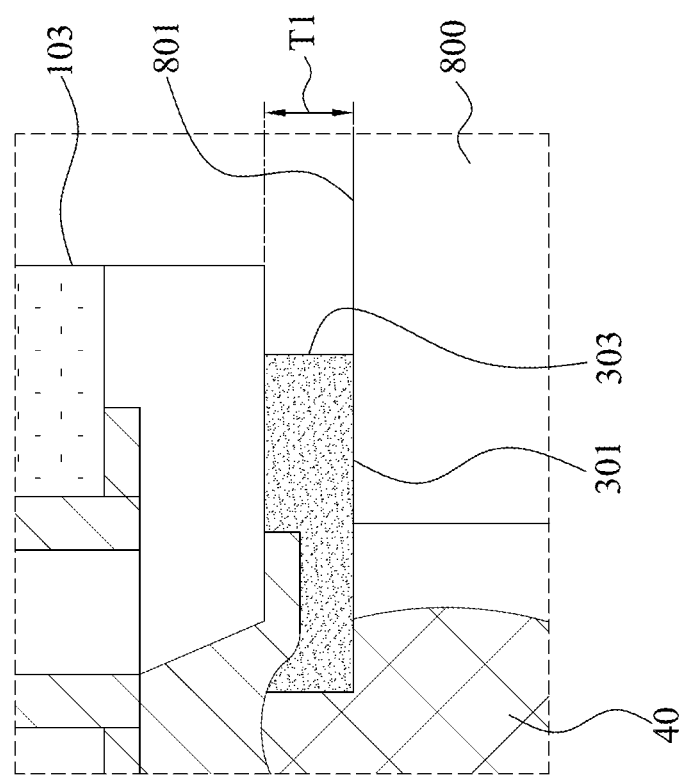
FIG. 5E1

ELECTRONIC PACKAGE STRUCTURE AND METHOD OF MANUFACTURING THE SAME

BACKGROUND

1. Technical Field

The present disclosure relates generally to an electronic package structure and a method of manufacturing an electronic package structure.

2. Description of the Related Art

A package structure may include a plurality of electronic components. However, interferences between adjacent electronic components may adversely affect the performance of the package structure. Therefore, a shielding layer may be needed to provide effective shielding between the adjacent electronic components. For example, a shielding layer is formed over a ball grid array (BGA) package by fixating the pre-shielding package on a tape, depositing a shielding layer, and remove the post-shielding package from the tape. Among which, the removal of the post-shielding package from the tape may generate metal burr at the region where the continuous shielding layer is broken by an external force to remove the package, and an additional cleaning operation, such as brushing or other mechanical approaches, is to be performed on the post-shielding package. However, the falling metal burr can be fallen into the BGA, causing a short circuit among the solder balls. The operation set forth may lead to a production yield loss of about 2% to 3%, and is commonly unacceptable in particular applications in the semiconductor packaging industry.

SUMMARY

In one or more embodiments, an electronic package structure includes a substrate, a conductive element, and a support structure. The substrate has a bottom surface and a lateral surface angled with the bottom surface. The conductive element is on the lateral surface of the substrate. The support structure is on the bottom surface of the substrate and configured to space the bottom surface from an external carrier. A lateral surface of the support structure is spaced apart from the lateral surface of the substrate by a first distance.

In one or more embodiments, an electronic package structure includes a substrate, a conductive element, and a support structure. The substrate has a bottom surface and a lateral surface angled with the bottom surface. The conductive element is disposed on the lateral surface of the substrate. The support structure is disposed on the bottom surface of the substrate. A lateral surface of the support structure has a non-vertical or a curved profile.

In one or more embodiments, an electronic package structure includes a substrate and a spacing element. The substrate has a bottom surface and a lateral surface non-parallel with the bottom surface. The spacing element is adjacent to the bottom surface of the substrate and providing a predetermined gap configured to space the bottom surface from an external carrier to prevent continuously disposing a shielding layer between the lateral surface and the external carrier.

BRIEF DESCRIPTION OF THE DRAWINGS

Aspects of the present disclosure are best understood from the following detailed description when read with the accompanying drawings. It is noted that various features may not be drawn to scale, and the dimensions of the various features may be arbitrarily increased or reduced for clarity of discussion.

FIG. 5A, FIG. 5B, FIG. 5C, FIG. 5C1, FIG. 5C2, FIG. 5D, FIG. 5D1, FIG. 5E, FIG. 5E1, FIG. 5F, and FIG. 5G illustrate various operations in a method of manufacturing an electronic package structure in accordance with some embodiments of the present disclosure.

Common reference numerals are used throughout the drawings and the detailed description to indicate the same or similar elements. The present disclosure will be more apparent from the following detailed description taken in conjunction with the accompanying drawings.

DETAILED DESCRIPTION

Figure 1:
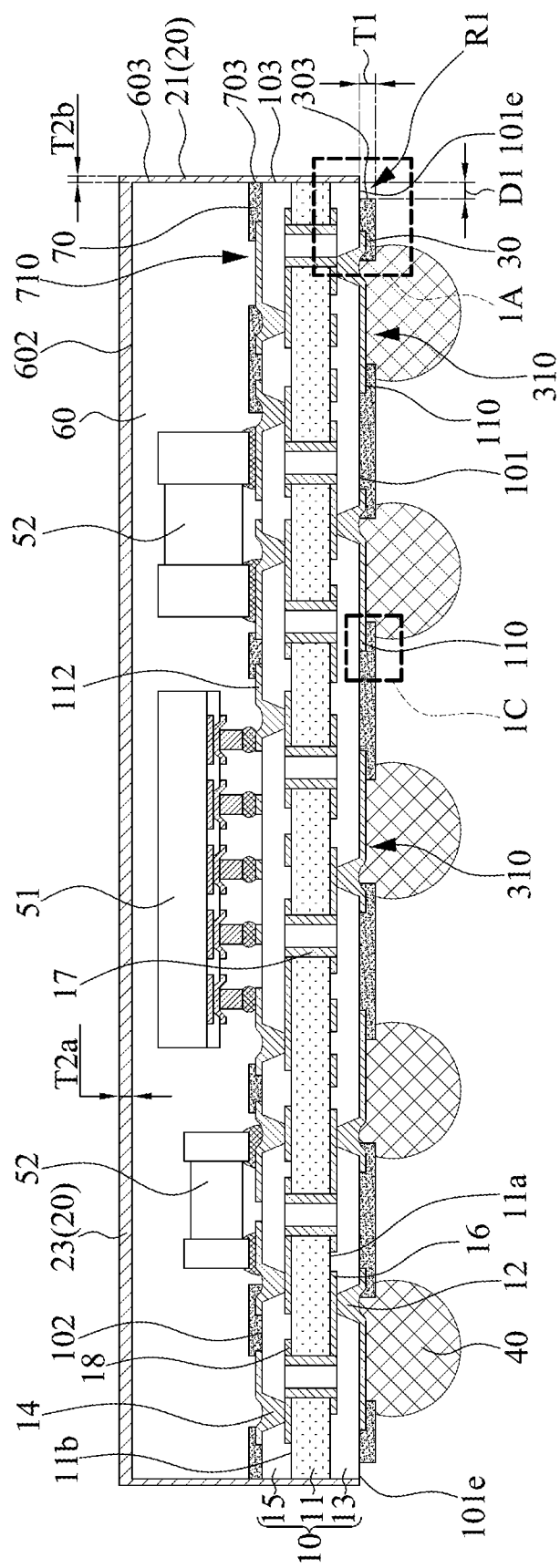
FIG. 1 illustrates a cross-sectional view of an electronic package structure in accordance with some embodiments of the present disclosure.

FIG. 1 illustrates a cross-sectional view of an electronic package structure in accordance with some embodiments of the present disclosure. The electronic package structure 1 includes a substrate 10, a conductive element 20, a support structure 30, electrical contacts 40, electronic components 51 and 52, an encapsulant 60, and a protection layer 70.

The substrate 10 may have a surface 101 (also referred to as "a bottom surface"), a surface 102 (also referred to as "an upper surface") opposite to the surface 101, and a lateral surface 103 angled or non-parallel with the surface 101. The substrate 10 may be, for example, a printed circuit board, such as a paper-based copper foil laminate, a composite copper foil laminate, or a polymer-impregnated glass-fiber-based copper foil laminate. The substrate 10 may include an interconnection structure, such as a plurality of conductive traces and/or conductive through vias. The substrate 10 may include an organic substrate or a leadframe. The substrate 10 may include a ceramic material or a metal plate. The substrate 10 may include an interposer.

In some embodiments, the substrate 10 includes a core layer 11, dielectric layers 13 and 15 on opposite surfaces 11a and 11b of the core layer 11, at least one interconnection via 17 passing through the core layer 11, at least one conductive via 12 passing through the dielectric layer 13, at least one conductive via 14 passing through the dielectric layer 15, at least one conductive layer 16 connected to the conductive via 12, and at least one conductive layer 18 connected to the conductive via 14. In some embodiments, the substrate 10 may include one or more conductive pads 110 in proximity to, adjacent to, or embedded in and exposed at the surface 101 of the substrate 10. The conductive pad 110 may be electrically connected to the conductive via 12. In some embodiments, the substrate 10 may include one or more conductive pads 112 in proximity to, adjacent to, or embedded in and exposed at the surface 102 of the substrate 10. The conductive pad 112 may be electrically connected to the conductive via 14.

The conductive element 20 may be disposed on the lateral surface 103 of the substrate 10. In some embodiments, the surface 101 of the substrate 10 is free of the conductive element 20. In some embodiments, the conductive element 20 is disposed over the surface 102 of the substrate 10. In some embodiments, the conductive element 20 includes a plurality of portions (e.g., portions 21, 22 and 23, which will be discussed in details hereinafter). In some embodiments, the portion 21 of the conductive element 20 is on the lateral surface 103 of the substrate 10. In some embodiments, the portion 23 of the conductive element 20 is disposed over the surface 102 of the substrate 10. In some embodiments, the portion 23 of the conductive element 20 has a thickness T2a. In some embodiments, the portion 21 of the conductive element 20 has a thickness T2b smaller than the thickness T2a of the portion 23 of the conductive element 20. In some embodiments, the thickness T2a is from about 2 μm to about 6 μm, or from about 3 μm to about 5 μm. In some embodiments, the thickness T2b is from about 1 μm to about 3 μm, or from about 1.5 μm to about 2.5 μm. In some embodiments, the conductive element 20 may be or include a shielding element or a shielding layer configured to provide an electromagnetic interference (EMI) protection for the electronic components 51 and 52, The conductive element 20 may include a conductive material, for example, aluminum (Al), copper (Cu), chromium (Cr), tin (Sn), gold (Au), silver (Ag), nickel (Ni) or stainless steel, or a mixture, an alloy, or other combination thereof.

The support structure 30 (also referred to as "a spacing element") may be on the surface 101 of the substrate 10. In some embodiments, the support structure 30 is configured to space the surface 101 (or the bottom surface) of the substrate from an external carrier. In some embodiments, the support structure 30 provides a predetermined gap configured to space the surface 101 (or the bottom surface) of the substrate from an external carrier to prevent continuously disposing a shielding layer (e.g., the conductive element 20) between the lateral surface 103 of the substrate and the external carrier. The external carrier may be an adhesive tape or a substrate (e.g., a carrier 800, which will be illustrated in FIGS. 5E-5G). In some embodiments, a lateral surface 303 of the support structure 30 is spaced apart from the lateral surface 103 of the substrate 10 by a distance D1. In some embodiments, the lateral surface 303 of the support structure 30 is indented from the lateral surface 103 of the substrate 10 by the distance D1. In some embodiments, the conductive element 20 is further disposed on a portion of the surface 101 of the substrate defined by the distance D1. In some embodiments, the lateral surface 303 is the outermost lateral surface of the support structure 30. In some embodiments, the distance D1 is greater than the thickness T2b of the portion 21 of the conductive element 20. In some embodiments, the distance D1 is greater than about 20 In some embodiments, the distance D1 is from about 100 μm to about 300 In some embodiments, the support structure 30 defines a plurality of openings 310. In some embodiments, the openings 310 of the support structure 30 expose the conductive pads 110 of the substrate 10. In some embodiments, the lateral surface 303 of the support structure 30 and the conductive element 20 collectively define a recess R1. In some embodiments, the lateral surface 303 of the support structure 30 and an edge portion 101e of the surface 101 of the substrate 10 exposed from the support structure 30 define the recess R1. In some embodiments, the edge portion 101e of the surface 101 is connected to the lateral surface 103 of the substrate 10.

In some embodiments, a thickness T1 of the support structure 30 is greater than the thickness T2a of the portion 23 of the conductive element 20. In some embodiments, a difference between the thickness T1 of the support structure 30 and the thickness T2a of the portion 23 of the conductive element 20 is greater than about 2 μm. In some embodiments, the thickness T1 of the support structure 30 is equal to or less than about 50 μm. In some embodiments, the thickness T1 of the support structure 30 is equal to or greater than about 10 μm. In some embodiments, the thickness T1 of the support structure 30 is from about 20 μm to about 35 μm. In some embodiments, the support structure 30 includes at least one portion of a solder mask.

The electrical contact 40 may be disposed on the surface 101 of the substrate 10. In some embodiments, the electrical contact 40 is disposed on the conductive pad 110. In some embodiments, a portion of the electrical contact 40 is disposed within the opening 310 of the support structure 30 and electrically connected to the conductive pad 110. In some embodiments, the recess R1 defined by the support structure 30 and the substrate 10 is spaced apart from the electrical contact 40.

The electronic components 51 and 52 may be disposed over the surface 102 of the substrate 10. The electronic components 51 and 52 may each be a chip or a die, one or more integrated circuit (IC) devices, and one or more overlying interconnection structures therein. The integrated circuit devices may include active devices such as transistors and/or passive devices such resistors, capacitors, inductors, or a combination thereof. In some embodiments, the electronic component 51 may be an active component, such as an integrated circuit chip or a die. In some embodiments, the electrical component 52 may be a passive electrical component, such as a capacitor, a resistor, or an inductor. Each electronic component 51, 52 may be electrically connected to one or more of another electronic components 51, 52 and to the substrate 10 (e.g., to the conductive pads 112), and the electrical connection may be attained by way of flip-chip or wire-bond techniques.

The encapsulant 60 may be disposed over the surface 102 of the substrate 10 and encapsulate the electronic components 51 and 52. In some embodiments, the portion 23 of the conductive element 20 directly or physically contacts a surface 602 (also referred to as "an upper surface") of the encapsulant 60. In some embodiments, the portion 21 of the conductive element 20 directly or physically contacts a lateral surface 603 of the encapsulant 60. In some embodiments, the lateral surface 603 of the encapsulant 60 is substantially coplanar with the lateral surface 103 of the substrate 10. In some embodiments, the encapsulant 60 may include an epoxy resin having fillers, a molding compound (e.g., an epoxy molding compound or other molding compound), polyimide, a phenolic compound or material, a material with a silicone dispersed therein, or a combination thereof.

The protection layer 70 may be disposed on the surface 102 of the substrate 10. In some embodiments, the protection layer 70 defines a plurality of openings 710. In some embodiments, the openings 710 of the protection layer 70 expose the conductive pads 112 of the substrate 10. In some embodiments, a lateral surface 703 of the protection layer 70 is substantially coplanar with the lateral surface 103 of the substrate 10. In some embodiments, the lateral surface 703 of the protection layer 70 is substantially coplanar with the lateral surface 603 of the encapsulant 60. In some embodiments, the encapsulant 60 directly or physically contacts the protection layer 70. In some embodiments, the protection layer 70 includes a patterned solder mask.

According to some embodiments of the present disclosure, the arrangement of the lateral surface 103 of the substrate 10 and the lateral surface 303 of the support structure 30 (e.g., the recess R1) can produce a discontinuous formation surface for the conductive element 20 in the manufacturing process, and thus it can prevent the conductive material (i.e., the material for forming the conductive element 20) from forming a continuous layer along the lateral surface 103 of the substrate 10 towards the carrier on which the substrate 10 is disposed. In other words, the portion of the as-formed conductive element 20 on the lateral surface 103 of the substrate 10 can be spaced apart from the portion of the conductive material formed on the upper surface of the carrier because of lacking of a continuous formation surface. Therefore, it can prevent the formation of metal burrs which could have been formed by pulling off a continuous layer of the conductive material when detaching the substrate 10 from the carrier. Accordingly, the prevention of formation of metal burrs can reduce the probability of occurrences of short circuits (i.e., between the electrical contacts 40 and the metal burrs that fall off when performing a deburring operation), which can increase the yields of the electronic package structure 1.

Moreover, according to some embodiments of the present disclosure, the recess R1 is defined by the substrate 10 and the support structure 30, and the formation of the recess R1 and the openings 310 for exposing the conductive pads 110 can be performed in the same operation. In other words, the openings 310 for the electrical contacts 40 and the recess R1 which benefits the prevention of metal burrs can be formed in the same operation. Therefore, additional operations are not required, and thus the process can be simplified.

In addition, according to some embodiments of the present disclosure, the support structure 30 including at least one portion of a solder mask can be formed by lithography operation, a screen printing operation, an inkjet printing operation, or a combination thereof, and therefore the recess R1 can be formed of a relatively high precision and having a relatively refined structure. Furthermore, the formation of cutting burrs resulting from mechanical cutting operations can be avoided, and thus the yields of the electronic package structure 1 can be increased.

Figure 1A:
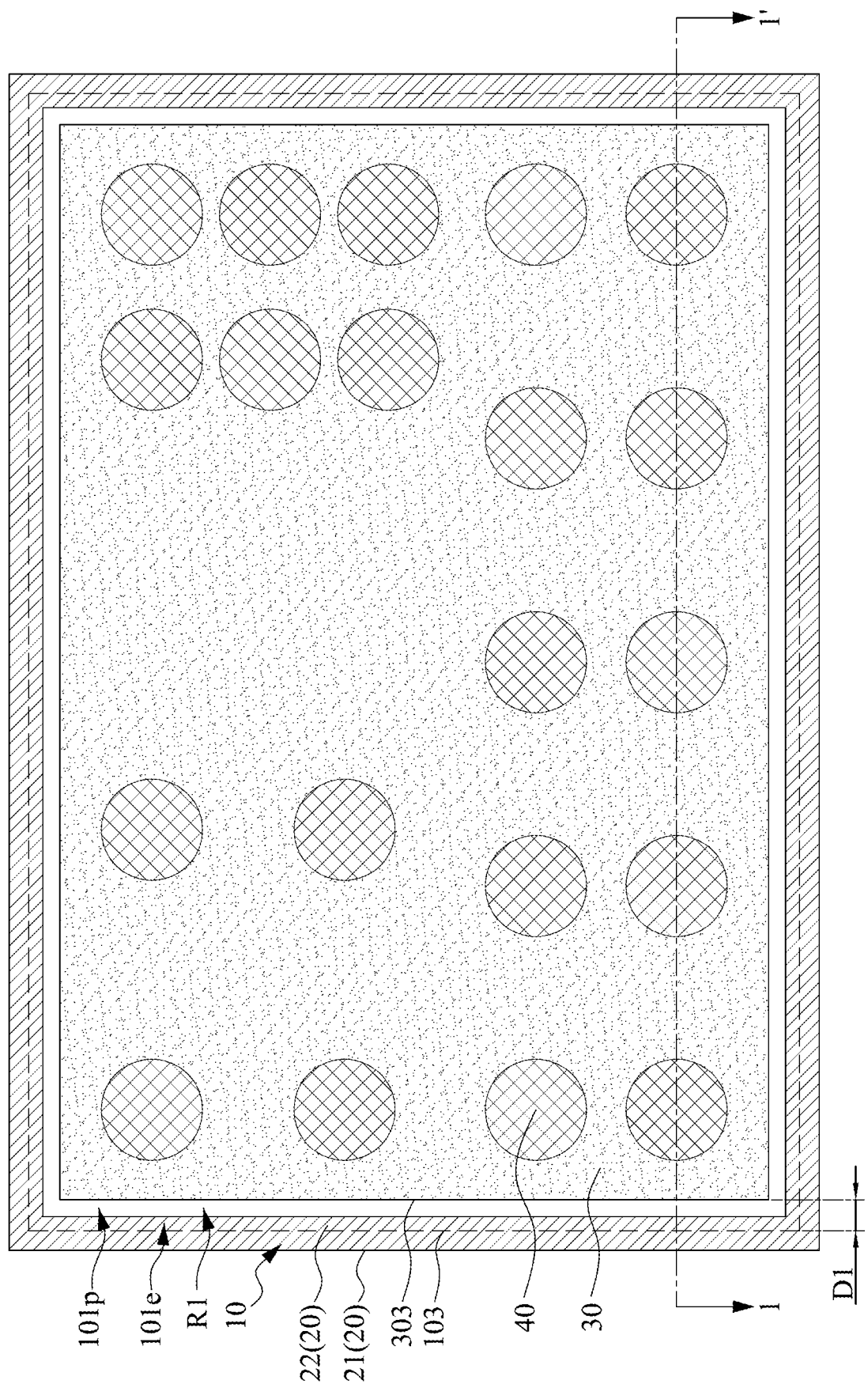
FIG. 1A illustrates a bottom view of an electronic package structure in accordance with some embodiments of the present disclosure.

FIG. 1A illustrates a bottom view of an electronic package structure 1 in accordance with some embodiments of the present disclosure. In some embodiments, FIG. 1A illustrates a top view of the electronic package structure 1 as viewed from the surface 101 of the substrate 10. In some embodiments, FIG. 1 illustrates a cross-sectional view along the cross-sectional line 1-1' in FIG. 1A.

In some embodiments, a plurality of the electrical contacts 40 are disposed on the surface 101 of the substrate 10. In some embodiments, the electrical contacts 40 may be separated into two or more groups, and a pitch of a first group of the electrical contacts 40 may be different from a pitch of a second group of the electrical contacts 40.

In some embodiments, the portion 22 of the conductive element 20 partially covers the edge portion 101e of the surface 101 of the substrate 10. In some embodiments, a peripheral region 101p of the surface 101 of the substrate 10 is exposed from the portion 22 of the conductive element 20. In some embodiments, the peripheral region 101p is within the edge portion 101e of the surface 101 of the substrate 10. In some embodiments, the edge portion 101e of the surface 101 includes the peripheral region 101p. In some embodiments, the peripheral region 101p (which is within the edge portion 101e) of the surface 101 of the substrate 10 is exposed from the support structure 30. In some embodiments, the edge portion 101e of the surface 101 of the substrate 10 surrounds the support structure 30. In some embodiments, the portion 22 of the conductive element 20 surrounds the support structure 30. In some embodiments, the portion 22 of the conductive element 20 surrounds the peripheral region 101p of the surface 101 of the substrate 10. In some embodiments, the peripheral region 101p of the surface 101 of the substrate 10 surrounds the support structure 30.

Figure 2A:
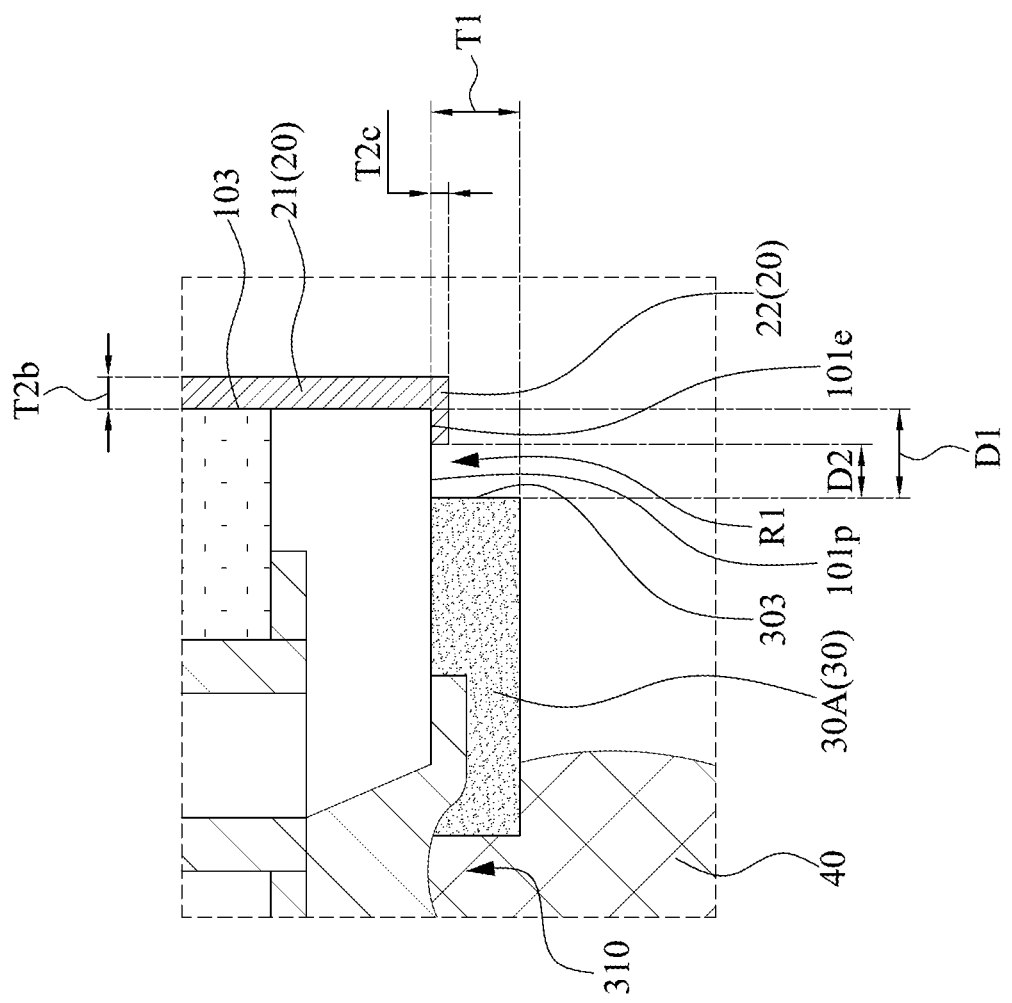
FIG. 2A illustrates a cross-sectional view of a portion of an electronic package structure in accordance with some embodiments of the present disclosure.

FIG. 2A illustrates a cross-sectional view of a portion of an electronic package structure 1 in accordance with some embodiments of the present disclosure. In some embodiments, FIG. 2A illustrates a cross-sectional view of the structure in the dashed box 1A of FIG. 1.

In some embodiments, the conductive element 20 further covers (or partially covers) the edge portion 101e of the surface 101 of the substrate 10. In some embodiments, the portion 22 of the conductive element 20 is on the edge portion 101e of the surface 101 of the substrate 10. In some embodiments, the portion 22 of the conductive element 20 is connected to the portion 21 of the conductive element 20 on the lateral surface 103 of the substrate 10. In some embodiments, a thickness T2c of the portion 22 of the conductive element 20 is less than the thickness T2b of the portion 21 of the conductive element 20. In some embodiments, the portion 22 of the conductive element 20 is disposed in the recess R1.

In some embodiments, the lateral surface 303 of the support structure 30 is spaced apart from the portion 22 of the conductive element 20 by a distance D2, and the distance D2 is less than the distance D1. In some embodiments, the portion 101p of the surface 101 of the substrate 10 is exposed from a space between the lateral surface 303 of the support structure 30 and the portion 22 of the conductive element 20. In some embodiments, the support structure 30 includes a portion 30A immediately adjacent to the lateral surface 103 of the substrate 10. In some embodiments, the recess R1 is spaced apart from the opening 310 by the portion 30A of the support structure 30. In some embodiments, the recess R1 is spaced apart from the electrical contact 40 by the portion 30A of the support structure 30.

Figure 2B:
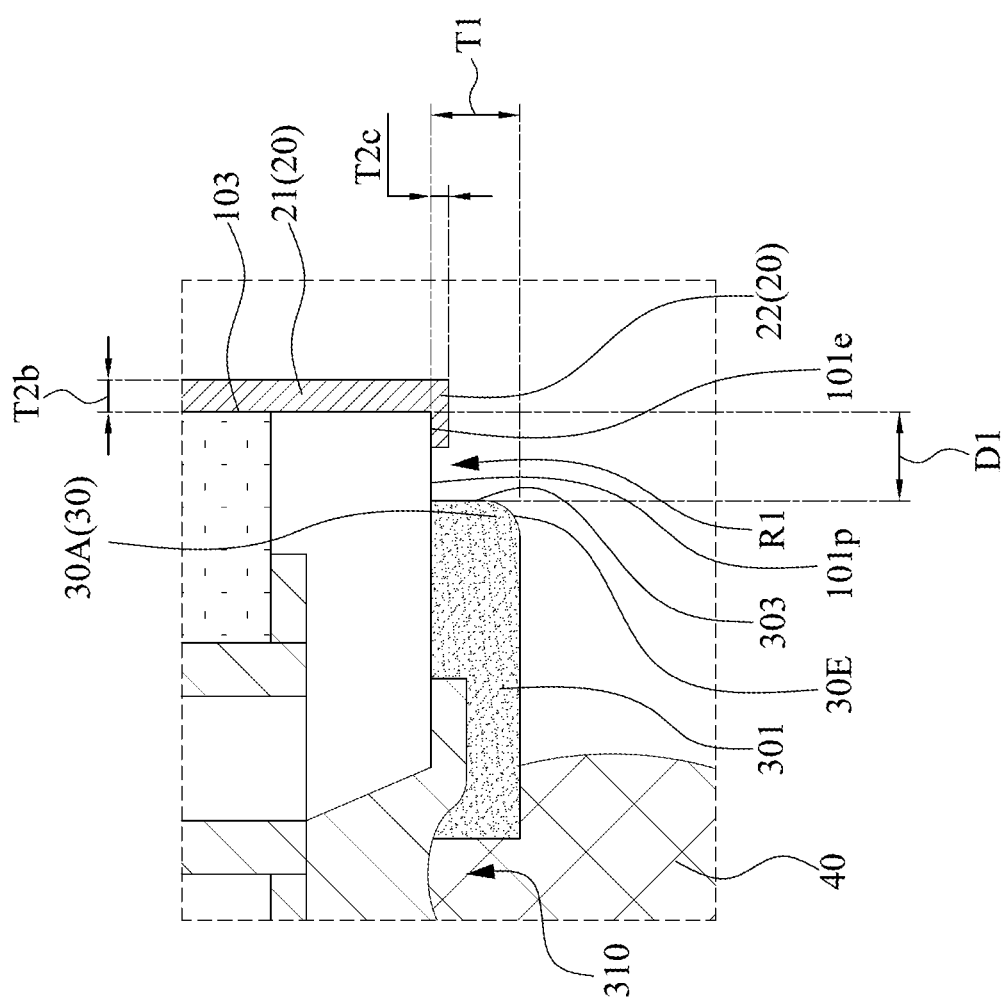
FIG. 2B illustrates a cross-sectional view of a portion of an electronic package structure in accordance with some embodiments of the present disclosure.

FIG. 2B illustrates a cross-sectional view of a portion of an electronic package structure 1 in accordance with some embodiments of the present disclosure. In some embodiments, FIG. 2B illustrates a cross-sectional view of the structure in the dashed box 1A of FIG. 1.

In some embodiments, the portion 30A of the support structure 30 has a lateral surface 303 with a non-vertical or a curved profile. In some embodiments, the portion 30A of the support structure 30 has a surface 301 (also referred to as "a bottom surface") with a non-vertical or a rounded profile. In some embodiments, a portion of the lateral surface 303 and a portion of the surface 301 form a curved edge 30E of the portion 30A of the support structure 30.

Figure 2C:
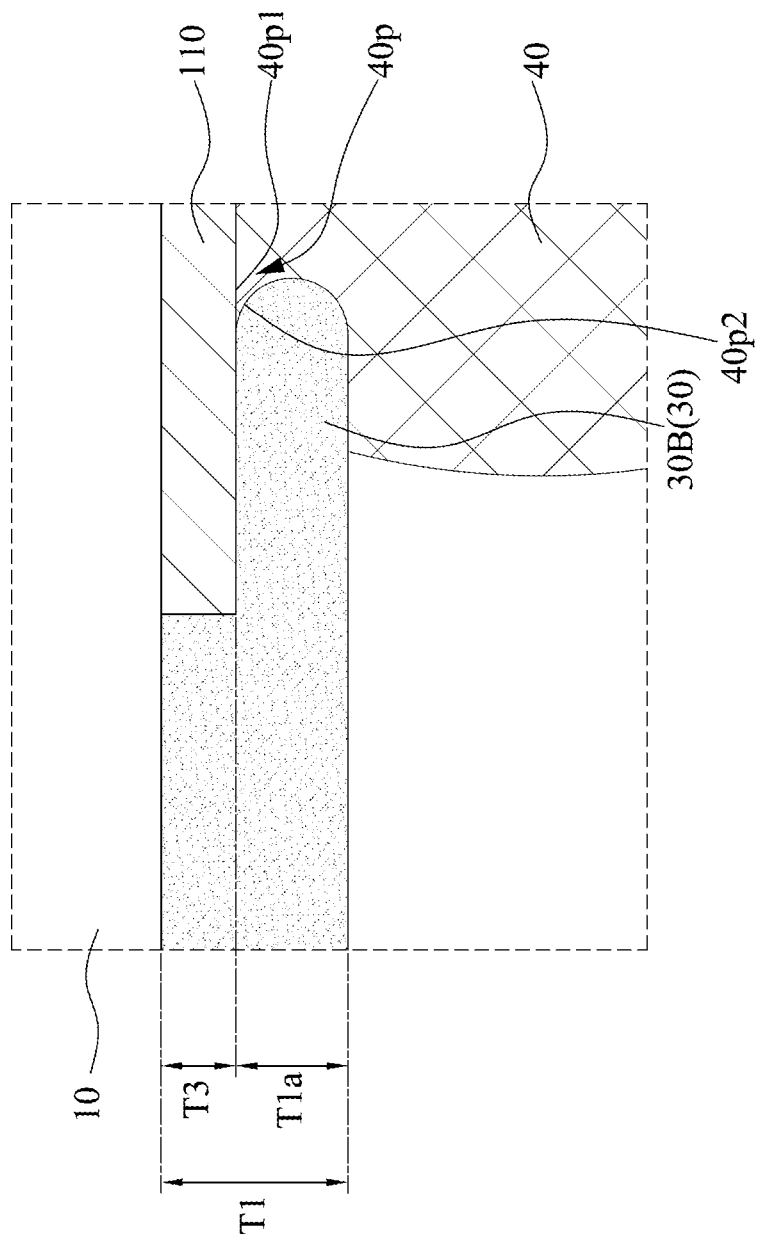
FIG. 2C illustrates a cross-sectional view of a portion of an electronic package structure in accordance with some embodiments of the present disclosure.

FIG. 2C illustrates a cross-sectional view of a portion of an electronic package structure 1 in accordance with some embodiments of the present disclosure. In some embodiments, FIG. 2C illustrates a cross-sectional view of the structure in the dashed box 1C of FIG. 1.

In some embodiments, the support structure 30 further includes a portion 30B in contact with the electrical contact 40. In some embodiments, the portion 30B is embedded in the electrical contact 40. In some embodiments, a portion 40p of the electrical contact 40 is between the conductive pad 110 and the portion 30B of the support structure 30. In some embodiments, a surface 40p1 and a surface 40p2 of the portion 40p of the electrical contact 40 define an acute angle. In some embodiments, the conductive pad 110 has a thickness T3 from about 10 µm to about 30 µm. In some embodiments, the portion 30B of the support structure 30 over the conductive pad 110 has a thickness T1a from about 10 µm to about 30 µm.

Figure 3:
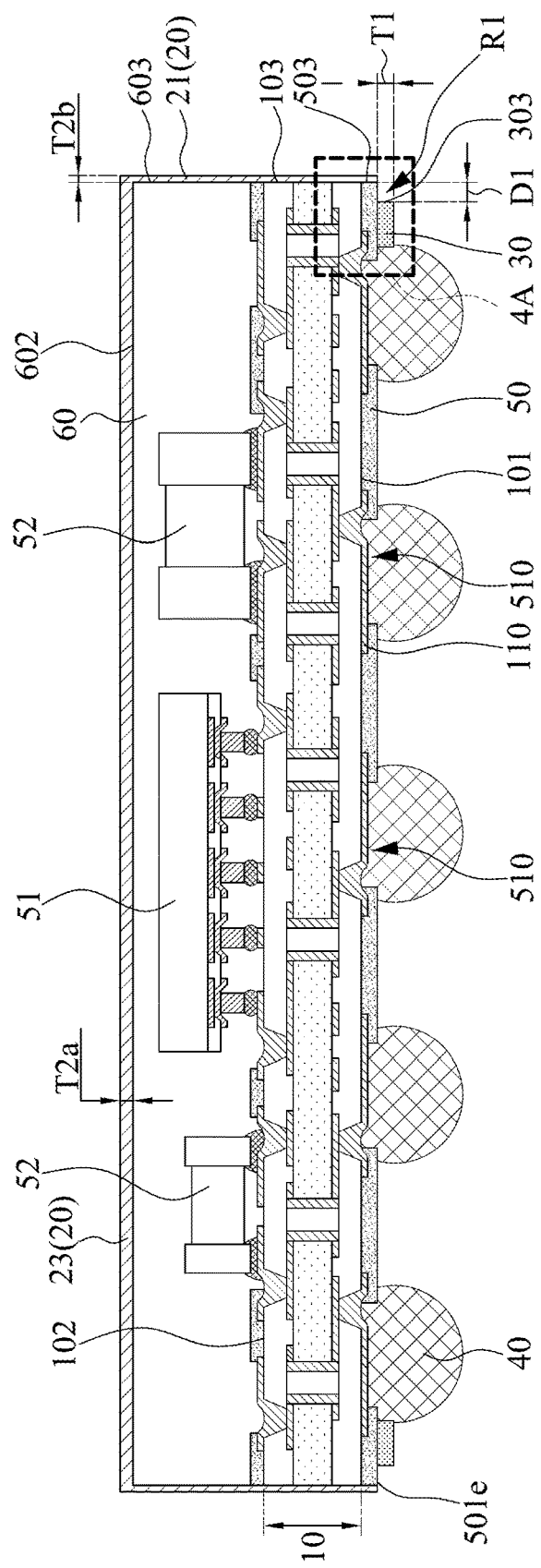
FIG. 3 illustrates a cross-sectional view of an electronic package structure in accordance with some embodiments of the present disclosure.

FIG. 3 illustrates a cross-sectional view of an electronic package structure in accordance with some embodiments of the present disclosure. The electronic package structure 2 is similar to the electronic package structure 1 in FIG. 1, and the differences therebetween are described as follows.

In some embodiments, the electronic package structure 2 further includes a protection layer 50 between the support structure 30 and the surface 101 of the substrate 10. In some embodiments, the protection layer 50 defines or has a plurality of openings 510, and the electrical contacts 40 are disposed within the openings 510 of the protection layer 50. In some embodiments, the protection layer 50 includes a patterned solder mask.

In some embodiments, the conductive element 20 further covers a portion of the protection layer 50. In some embodiments, the conductive element 20 further covers a lateral surface 503 of the protection layer 50. In some embodiments, the lateral surface 303 of the support structure 30 is spaced apart from the lateral surface 503 of the protection layer 50 by the distance D1. In some embodiments, the lateral surface 303 of the support structure 30 and an edge portion 501e of a surface 501 (also referred to as "a bottom surface") of the protection layer 50 exposed from the support structure 30 define the recess R1. In some embodiments, the edge portion 501e of the surface 501 is connected to the lateral surface 503 of the protection layer 50.

Figure 3A:
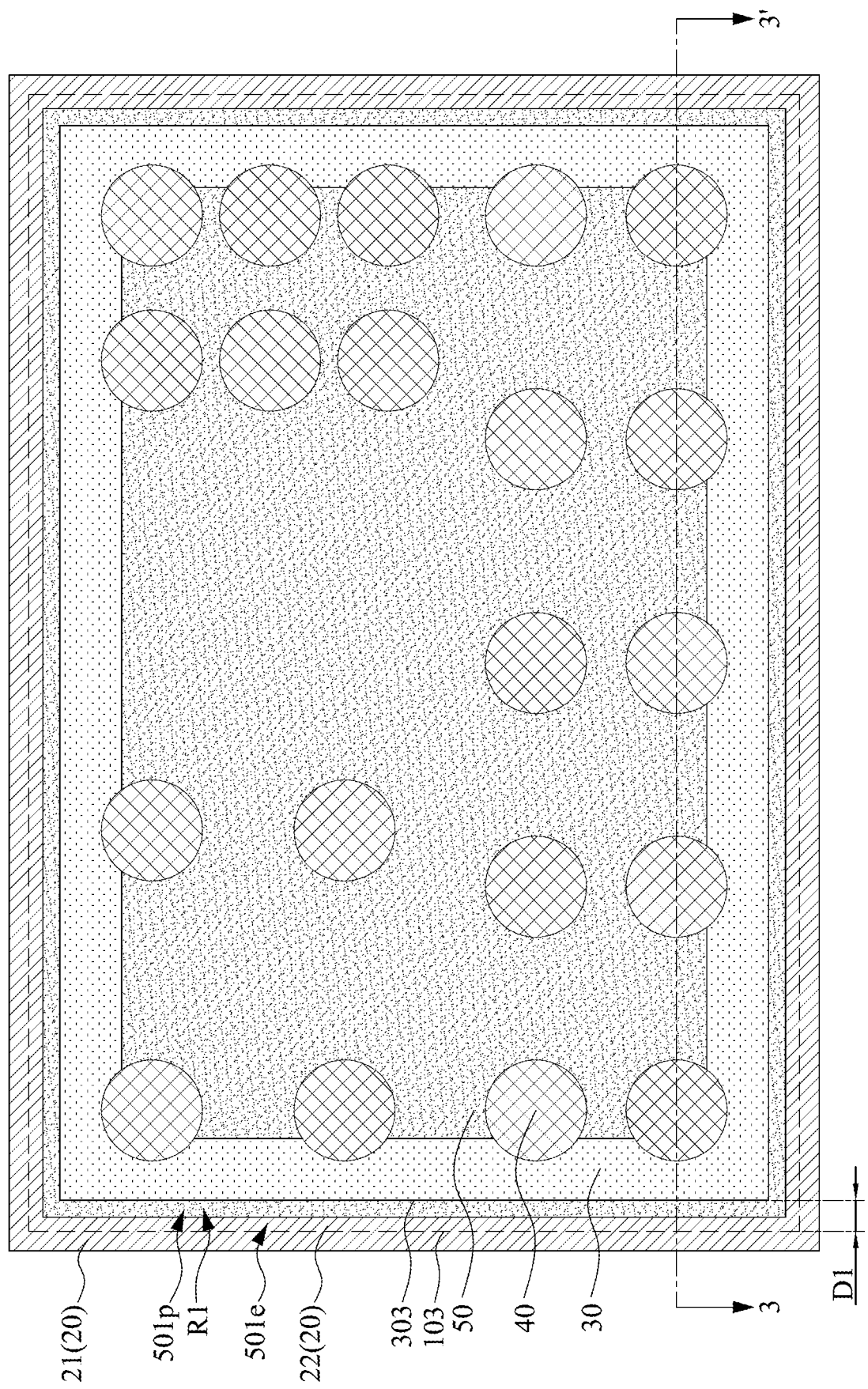
FIG. 3A illustrates a bottom view of an electronic package structure in accordance with some embodiments of the present disclosure.

FIG. 3A illustrates a top view of an electronic package structure 2 in accordance with some embodiments of the present disclosure. In some embodiments, FIG. 3A illustrates a bottom view of the electronic package structure 2 as viewed from the surface 101 of the substrate 10. In some embodiments, FIG. 3 illustrates a cross-sectional view along the cross-sectional line 3-3' in FIG. 3A.

In some embodiments, the portion 22 of the conductive element 20 partially covers the edge portion 501e of the surface 501 of the protection layer 50. In some embodiments, a peripheral region 501p of the surface 501 of the protection layer 50 is exposed from the portion 22 of the conductive element 20. In some embodiments, the peripheral region 501p is within the edge portion 501e of the surface 501 of the protection layer 50. In some embodiments, the peripheral region 501p (which is within the edge portion 501e) of the surface 501 of the protection layer 50 is exposed from the support structure 30. In some embodiments, the peripheral region 501p of the surface 501 of the protection layer 50 is exposed from a space between the lateral surface 303 of the support structure 30 and the conductive element 20. In some embodiments, the edge portion 501e of the surface 501 of the protection layer 50 surrounds the support structure 30. In some embodiments, the peripheral region 501p of the surface 501 of the protection layer 50 surrounds the support structure 30.

Figure 4A:
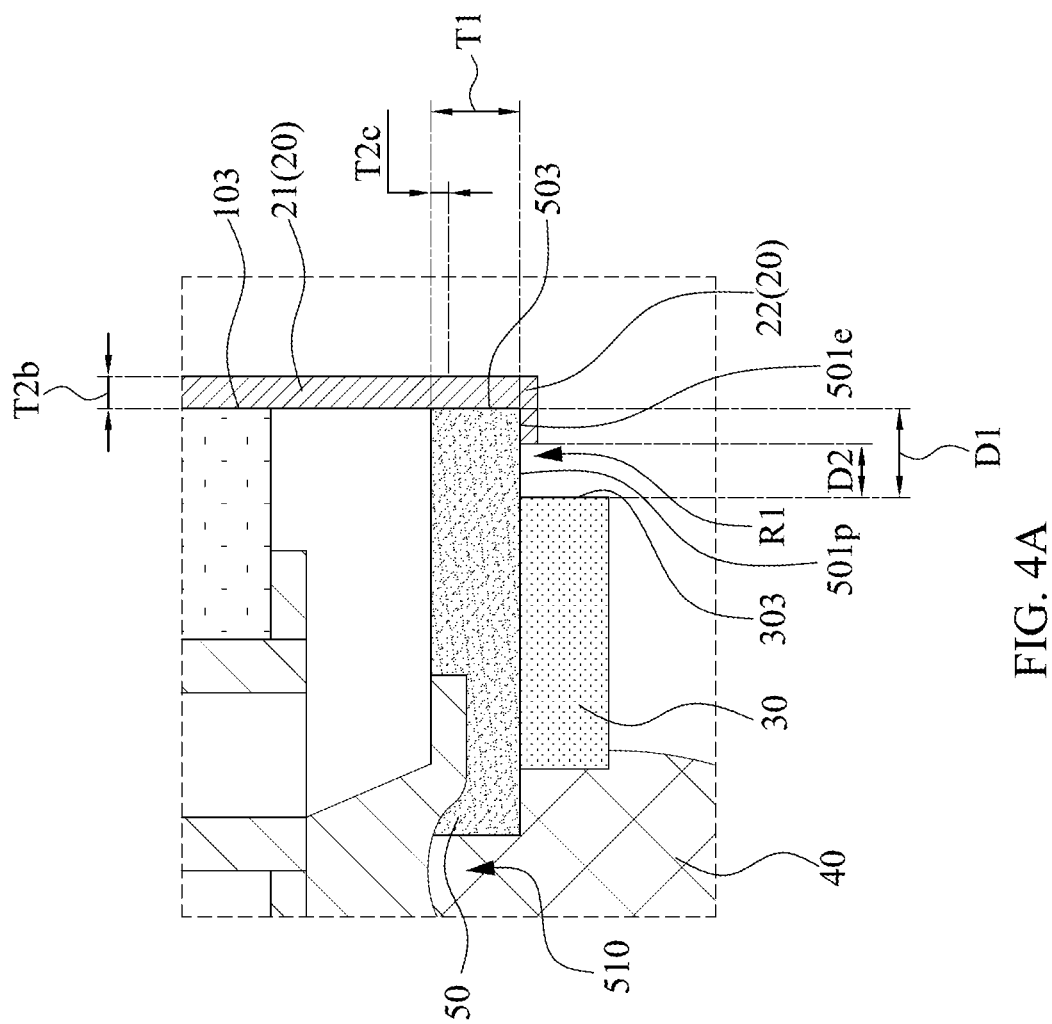
FIG. 4A illustrates a cross-sectional view of a portion of an electronic package structure in accordance with some embodiments of the present disclosure.

FIG. 4A illustrates a cross-sectional view of a portion of an electronic package structure 2 in accordance with some embodiments of the present disclosure. In some embodiments, FIG. 4A illustrates a cross-sectional view of the structure in the dashed box 4A of FIG. 3.

In some embodiments, the conductive element 20 further covers (or partially covers) the edge portion 501e of the surface 501 of the protection layer 50. In some embodiments, the portion 22 of the conductive element 20 is on the edge portion 501e of the surface 501 of the protection layer 50. In some embodiments, the portion 22 of the conductive element 20 is connected to the portion 21 of the conductive element 20 on the lateral surface 503 of the protection layer 50. In some embodiments, the portion 22 of the conductive element 20 is in the recess R1 defined by the protection layer 50 and the support structure 30.

In some embodiments, the support structure 30 is immediately adjacent to the lateral surface 503 of the protection layer 50. In some embodiments, the recess R1 is spaced apart from the opening 510 by the support structure 30. In some embodiments, the recess R1 is spaced apart from the electrical contact 40 by the support structure 30. In some embodiments, the electrical contact 40 directly or physically contacts the support structure 30 and the protection layer 50.

Figure 4B:
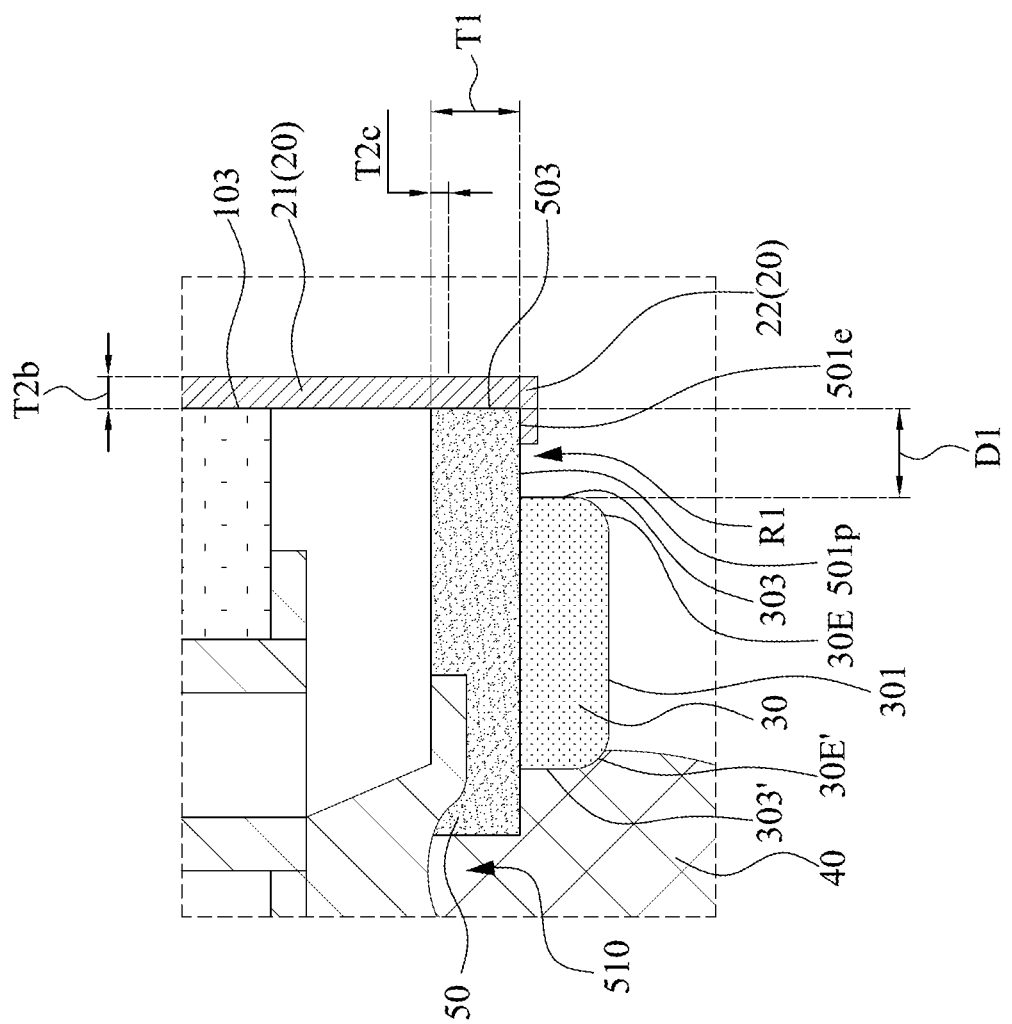
FIG. 4B illustrates a cross-sectional view of a portion of an electronic package structure in accordance with some embodiments of the present disclosure.

FIG. 4B illustrates a cross-sectional view of a portion of an electronic package structure 2 in accordance with some embodiments of the present disclosure. In some embodiments, FIG. 4B illustrates a cross-sectional view of the structure in the dashed box 4A of FIG. 3.

In some embodiments, the support structure 30 has a lateral surface 303 with a non-vertical or a rounded profile. In some embodiments, the support structure 30 further has a lateral surface 303' opposite to the lateral surface 303, and the lateral surface 303' has a non-vertical or a rounded profile. In some embodiments, the lateral surface 303' directly or physically contacts the electrical contact 40. In some embodiments, a portion of the lateral surface 303 and a portion of the surface 301 form a curved edge 30E of the support structure 30. In some embodiments, a portion of the lateral surface 303' and a portion of the surface 301 form a curved edge 30E' of the support structure 30. In some embodiments, the cured edge 30E' of the support structure 30 directly or physically contacts the electrical contact 40.

FIG. 5A, FIG. 5B, FIG. 5C, FIG. 5C1, FIG. 5C2, FIG. 5D, FIG. 5D1, FIG. 5E, FIG. 5E1, FIG. 5F, and FIG. 5G illustrate various operations in a method of manufacturing an electronic package structure 1 in accordance with some embodiments of the present disclosure.

Figure 5A:
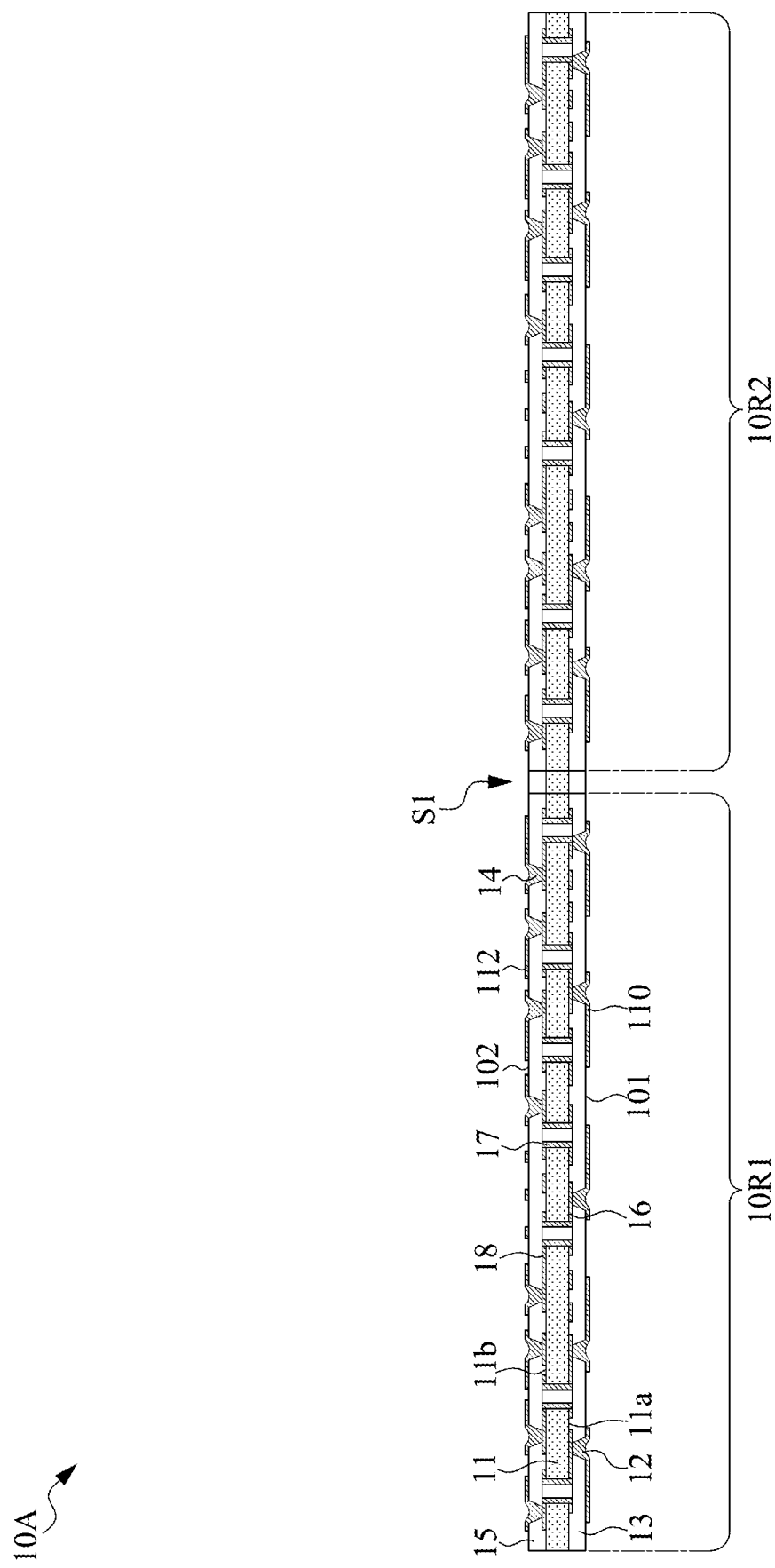

Referring to FIG. 5A, a substrate layer 10A may be provided. In some embodiments, the substrate layer 10A has at least two device regions 10R1 and 10R2 and a predetermined cutting line region S1 between the device region 10R1 and the device region 10R2. In some embodiments, the substrate layer 10A has a surface 101 and a surface 102 opposite to the surface 101. In some embodiments, the substrate layer 10A includes a core layer 11, dielectric layers 13 and 15 on opposite surfaces 11a and 11b of the core layer 11, at least one interconnection via 17 passing through the core layer 11, at least one conductive via 12 passing through the dielectric layer 13, at least one conductive via 14 passing through the dielectric layer 15, at least one conductive layer 16 connected to the conductive via 12, at least one conductive layer 18 connected to the conductive via 14, one or more conductive pads 110 exposed at the surface 101 of the substrate 10, and one or more conductive pads 112 exposed at the surface 102 of the substrate 10.

Figure 5B:
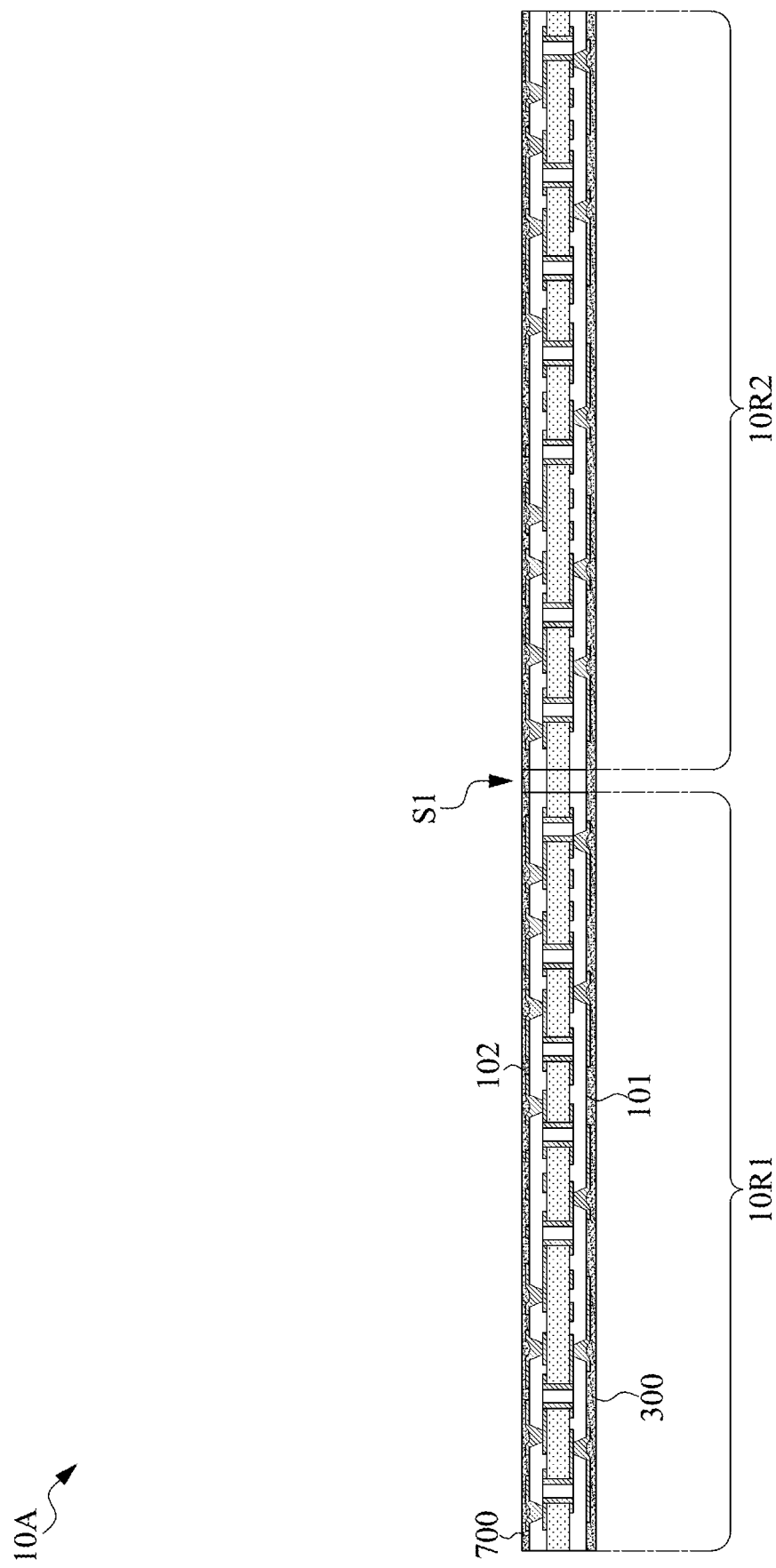

Referring to FIG. 5B, an insulating layer 300 may be formed on the surface 101 of the substrate 10. In some embodiments, the insulating layer 300 is formed on the device regions 10R1 and 10R2 and the predetermined cutting line region S1 of the substrate 10. In some embodiments, an insulating layer 700 is formed on the surface 102 of the substrate 10. In some embodiments, the insulating layers 300 and 700 may include the same or different materials. In some embodiments, the insulating layers 300 and 700 include a solder resist material.

Figure 5C:
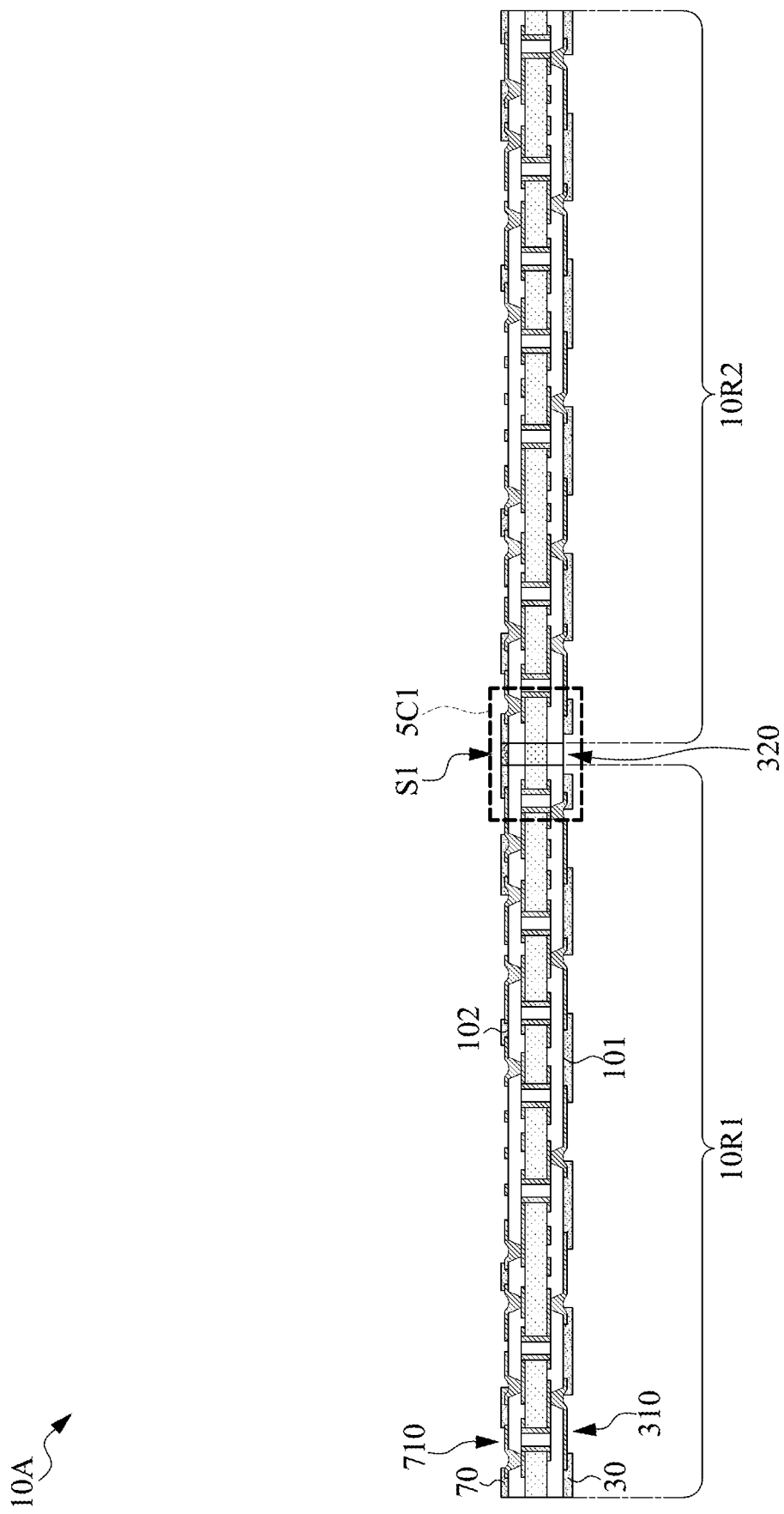

Referring to FIG. 5C, a portion (also referred to as "a first portion") of the insulating layer 300 may be removed to expose the predetermined cutting line region S1 of the substrate layer 10A to form a support structure 30 on the surface 101 of the substrate layer 10A. In some embodiments, a portion (or a first portion) of the insulating layer 300 is removed to form an opening 320 to expose the predetermined cutting line region S1 of the substrate layer 10A.

In some embodiments, still referring to FIG. 5C, another portion (also referred to as "a second portion") of the insulating layer 300 is further removed to form openings 310 to expose the conductive pads 110 of the substrate 10. In some embodiments, removing the first portion of the insulating layer 300 to expose the predetermined cutting line region S1 and removing the second portion of the insulating layer 300 to form the openings 310 are performed in the same operation. In some embodiments, a portion of the insulating layer 700 is removed to form openings 710 to expose the conductive pads 120 of the substrate layer 10A, so as to form a protection layer 70.

Referring to FIG. 5C1, which illustrates a cross-sectional view of the structure in the dashed box 5C1 of FIG. 5C in accordance with some embodiments of the present disclosure, a portion of the surface 101 of the substrate layer 10A corresponding to the predetermined cutting line region S1 may be exposed from the support structure 30 (e.g., the opening 320 of the support structure 30). In some embodiments, a width W1 of the opening 320 of the support structure 30 is greater than a width W2 of the predetermined cutting line region S1. In some embodiments, a portion of the surface 102 of the substrate layer 10A corresponding to the predetermined cutting line region S1 is covered by the protection layer 70.

Referring to FIG. 5C2, which illustrates a top view of the structure shown in FIG. 5C as viewed from the surface 101 of the substrate layer 10A in accordance with some embodiments of the present disclosure, the predetermined cutting line region S1 of the surface 101 may be exposed from the support structure 30. In some embodiments, the conductive pads 110 may be exposed from the openings 310 of the support structure 30.

In some embodiments, the support structure 30 may be formed by a lithography operation, a screen printing operation, an inkjet printing operation, or a combination thereof. For example, in the embodiments illustrated in FIGS. 5B-5C2, the support structure 30 is formed by a lithography operation.

In some other embodiments, the support structure 30 may be formed by a mask-less operation (e.g., a screen printing operation or an inkjet printing operation). For example, referring to FIG. 5A, forming the support structure 30 may include applying an insulating material on the device regions 10R1 and 10R2 of the substrate layer 10A with a predetermined pattern to form the support structure 30. In some embodiments, the insulating material is applied on the device regions 10R1 and 10R2 of the surface 101 of the substrate layer 10A with the predetermined pattern. In some embodiments, the predetermined pattern of the insulating material exposes the predetermined cutting line region S1 of the substrate layer 10A.

Figure 5D:
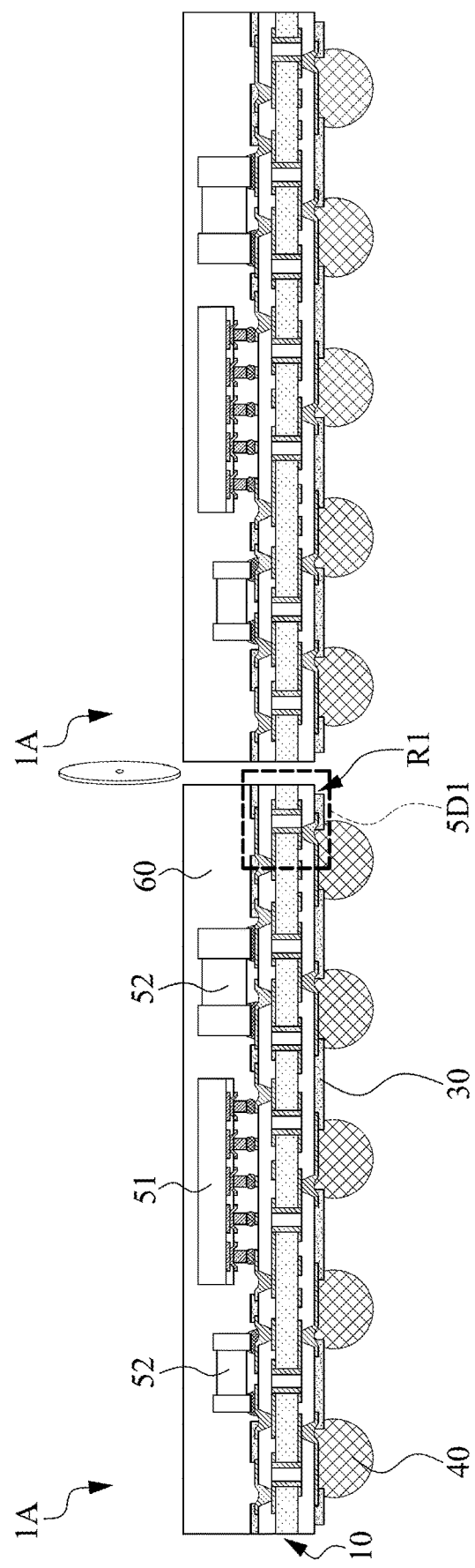

Referring to FIG. 5D, electronic components 51 and 52 may be disposed over the surface 102 of the substrate layer 10A, an encapsulant 60 may be disposed over the surface 102 of the substrate layer 10A to encapsulate the electronic components 51 and 52, electrical contacts 40 may be disposed on the surface 101 of the substrate layer 10A, and a singulation operation may be performed along the predetermined cutting line region S1. In some embodiments, forming the support structure 30 is prior to performing the singulation operation. In some embodiments, referring to FIG. 5D1, which illustrates a cross-sectional view of the structure in the dashed box 5D1 of FIG. 5D in accordance with some embodiments of the present disclosure, each of the singulated structures 1A includes a substrate 10 having the surface 101, the surface 102 opposite to the surface 101, and a lateral surface 103 angled with the surface 101, and a lateral surface 303 of the support structure 30 is spaced apart from the lateral surface 103 of the substrate 10 by a distance D1. In some embodiments, the distance D1 in defined by the width W1 of the opening 320 and the width W2 of the predetermined cutting line region S1. In some embodiments, the lateral surface 303 recessed from the lateral surface 103 defines a recess R1. In some embodiments, the lateral surface 303 of the support structure 30 and an edge portion 101e of the surface 101 of the substrate define the recess R1.

Figure 5E:
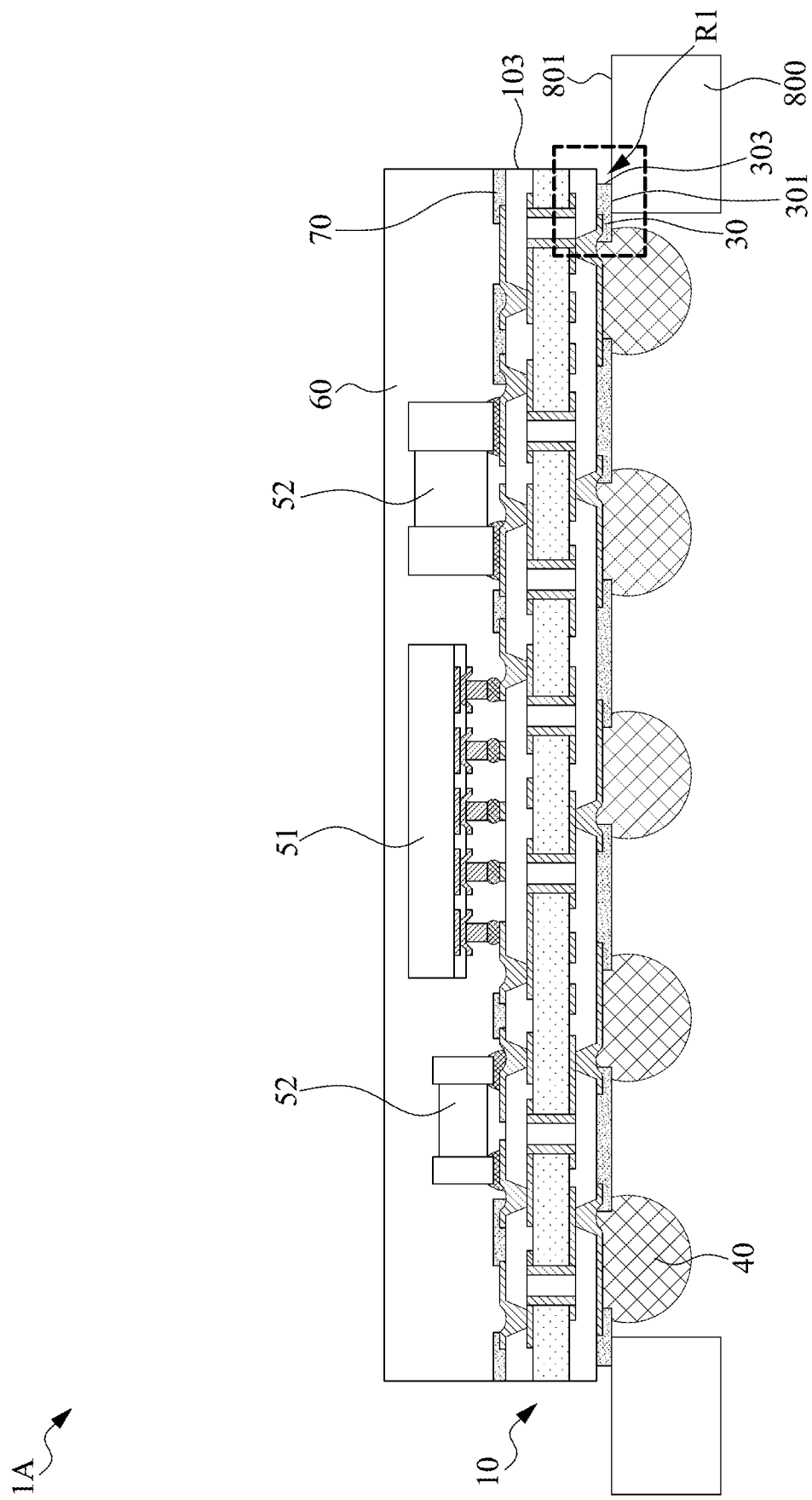

Referring to FIG. 5E and FIG. 5E1, which illustrates a cross-sectional view of the structure in the dashed box 5E1 of FIG. 5E in accordance with some embodiments of the present disclosure, the singulated structure 1A may be disposed on a carrier 800. In some embodiments, the carrier 800 may be a tape. In some embodiments, the support structure 30 contacts an upper surface 801 of the carrier 800. In some embodiments, the upper surface 801 of the carrier 800, the lateral surface 303 of the support structure 30, and the edge portion 101e of the surface 101 of the substrate 10 define the recess R1. In some embodiments, the thickness T1 of the support structure 30 defines the height of the recess R1.

Figure 5F:
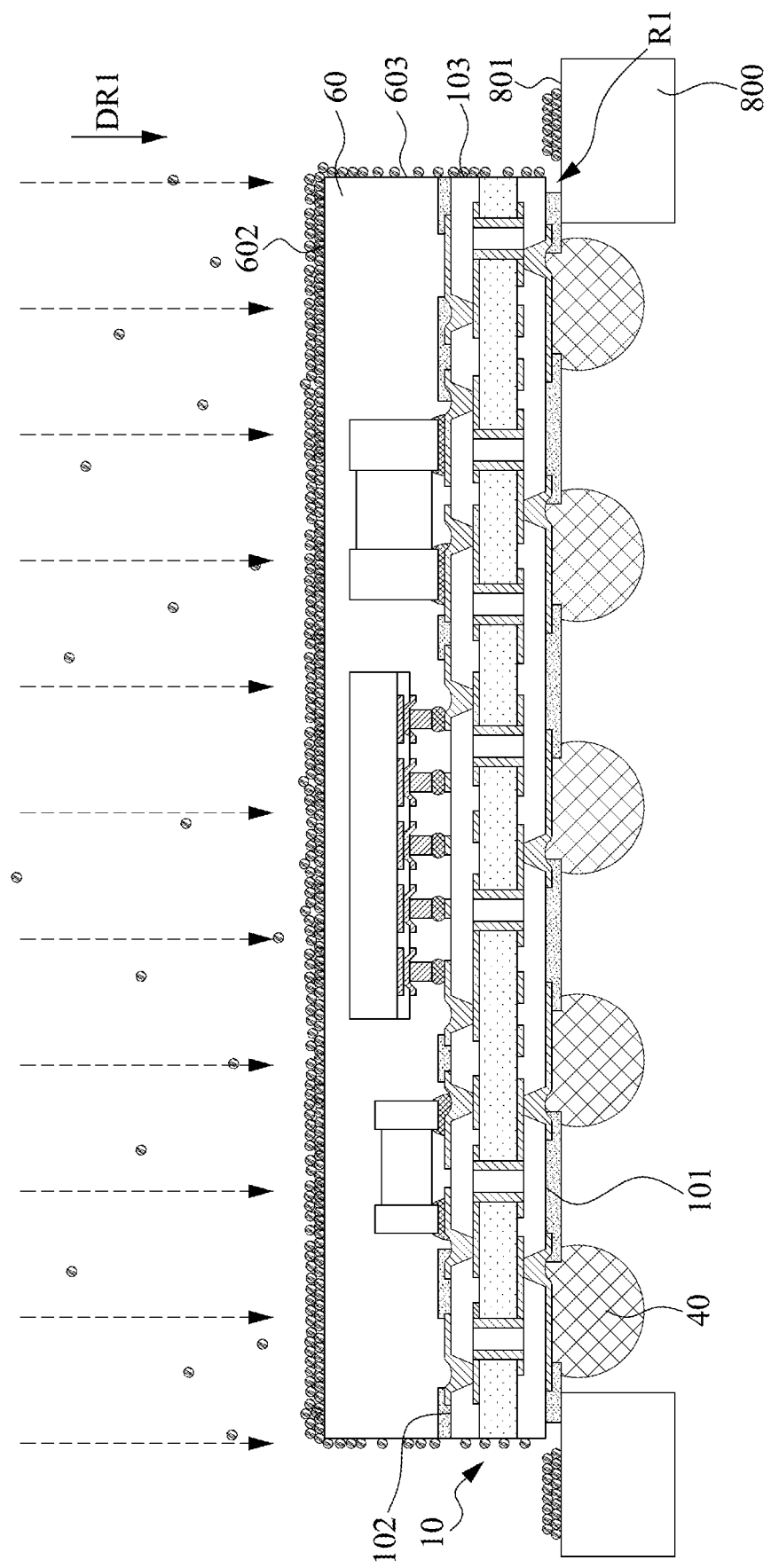

Referring to FIG. 5F, a conductive element 20 may be formed over the substrate 10. In some embodiments, forming the conductive element 20 is after performing the singulation operation. In some embodiments, forming the conductive element 20 includes performing a physical vapor deposition (PVD) operation with a conductive material 20A over the substrate 10. In some embodiments, the PVD operation is performed along a direction DR1 from the surface 102 towards the surface 101 of the substrate 10. That is, in some embodiments, atoms of the conductive material 20A move along the direction DR1 (e.g., the direction of the electric field in the PVD operation) substantially in parallel to the lateral surface 103 of the substrate 10. In some embodiments, atoms of the conductive material 20A move along the direction DR1 towards the surfaces 602 and 603 of the encapsulant 60, the lateral surface 103 of the substrate 10, and the upper surface 801 of the carrier 800. In some embodiments, the conductive material 20A is formed on the surfaces 602 and 603 of the encapsulant 60, the lateral surface 103 of the substrate 10, and the upper surface 801 of the carrier 800 by PVD.

Figure 5G:
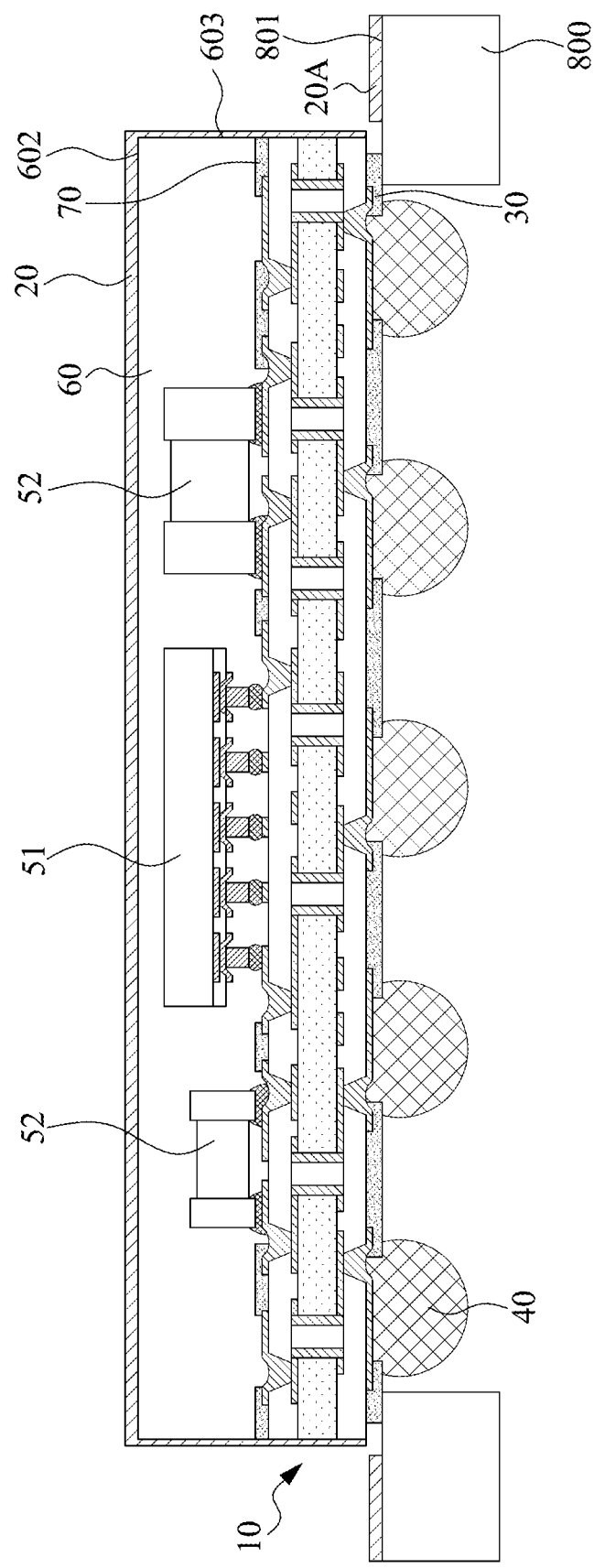

Referring to FIG. 5G, the conductive element 20 may be formed on the surfaces 602 and 603 of the encapsulant 60 and the lateral surface 103 of the substrate 10. A layer of the conductive material 20A may be formed on the upper surface 801 of the carrier 800. In some embodiments, the conductive element 20 is spaced apart from the layer of the conductive material 20A on the carrier 800.

Next, the carrier 800 may be removed. As such, the electronic package structure 1 illustrated in FIG. 1 is formed.

According to some embodiments of the present disclosure, the arrangement of the lateral surface 103 of the substrate 10 and the lateral surface 303 of the support structure 30 (e.g., the recess R1) can produce a discontinuous deposition surface for the PVD operation, and thus it can prevent the conductive material 20A from forming a continuous layer along the lateral surface 103 of the substrate 10 towards the upper surface 801 of the carrier 800. In other words, the portion of the conductive material 20A on the lateral surface 103 of the substrate 10 is spaced apart from the portion of the conductive material 20A on the upper surface 801 of the carrier 800 because of lacking of a continuous deposition surface. Therefore, it can prevent the formation of metal burrs which could have been formed by pulling off a continuous layer of the conductive material 20A when detaching the singulated structure 1A from the carrier 800. Accordingly, the prevention of formation of metal burrs can reduce the probability of occurrences of short circuits, which can increase the yields of the electronic package structure 1.

In addition, according to some embodiments of the present disclosure, atoms of the conductive material 20A move along the direction DR1 (which is the direction of the electric field in the PVD operation) substantially in parallel to the lateral surface 103 of the substrate 10. Therefore, since the PVD operation is highly directional, the probability of the atoms entering the recess R1 which is recessed from the lateral surface 103 of the substrate 10 can be significantly reduced. Accordingly, the design of the recess R1 can prevent the conductive material 20A from forming a continuous layer along the lateral surface 103 of the substrate 10 towards the upper surface 801 of the carrier 800, the formation of metal burrs can be reduced, and thus the probability of occurrences of short circuits can be reduced, which can increase the yields of the electronic package structure 1.

Moreover, according to some embodiments of the present disclosure, the formation of the openings 310 and 320 of the support structure 30 can be performed in the same operation. In other words, the openings 310 for the electrical contacts 40 and the opening 320 for forming the recess R1 which benefits the prevention of metal burrs can be formed in the same operation. Therefore, additional operations are not required, and thus the process can be simplified.

Furthermore, compared to the cases when a substrate has a recess proximal to a bottom surface and a lateral surface of the substrate, the formation of a recess of a substrate requires a mechanical pre-cutting operation followed by a singulation, and thus the formation of a recess of a substrate requires additional manufacturing operations, not to mention that the relatively low precision provided by the mechanical pre-cutting operation, which may decrease the effects of preventing the formation of metal burrs as well as the yields of the electronic package structure. In contrast, according to some embodiments of the present disclosure, the recess R1 is defined by the support structure 30 and the substrate 10. Since the support structure 30 may be formed by a lithography operation, a screen printing operation, an inkjet printing operation, or a combination thereof, the recess R1 can be formed of a relatively high precision and having a relatively refined structure, the formation of cutting burrs can be avoided, and thus the yields of the electronic package structure 1 can be increased.

Figure 6A:
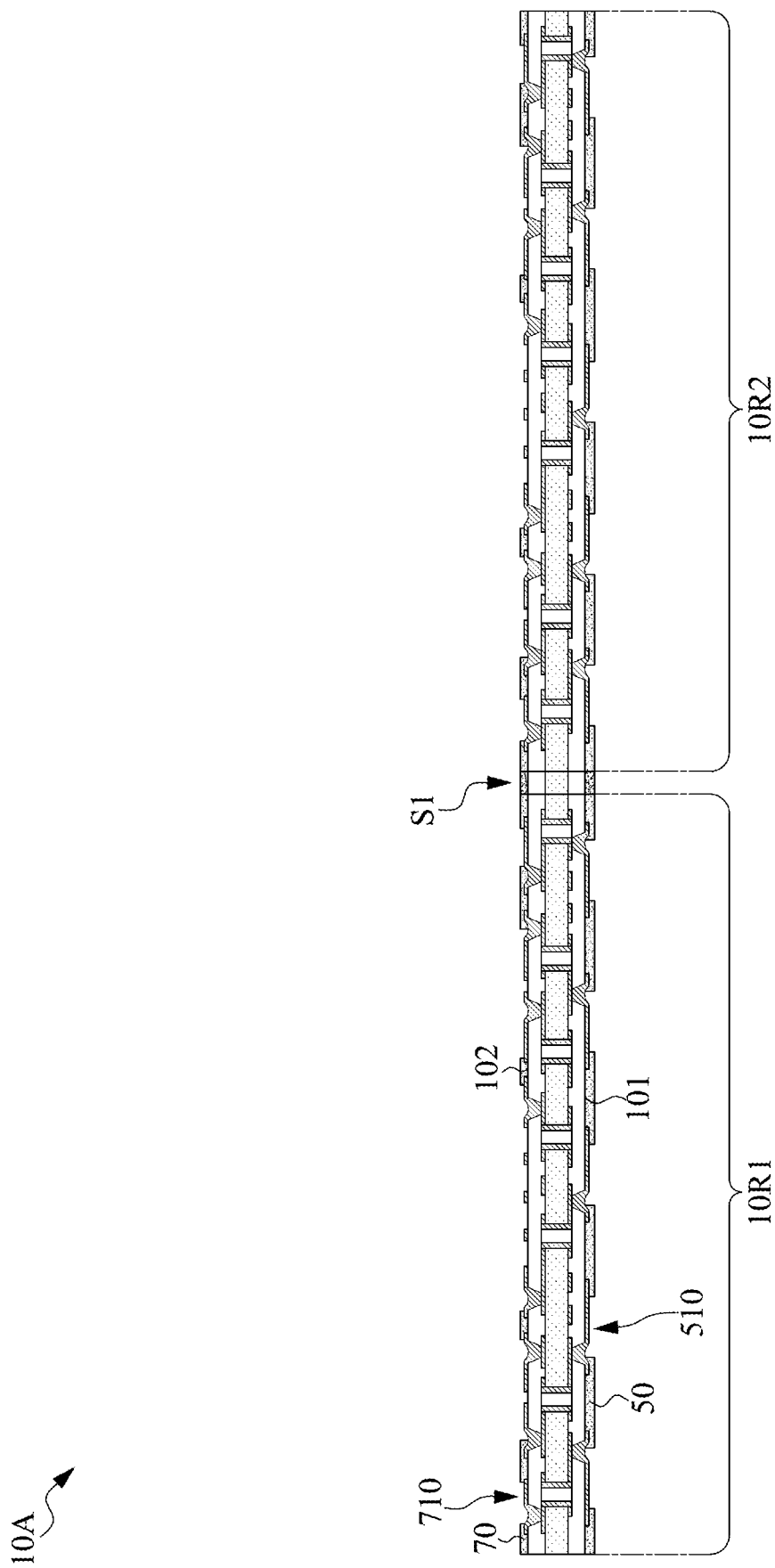
FIG. 6A, FIG. 6B, and FIG. 6C illustrate various operations in a method of manufacturing an electronic package structure in accordance with some embodiments of the present disclosure.
Figure 6B:
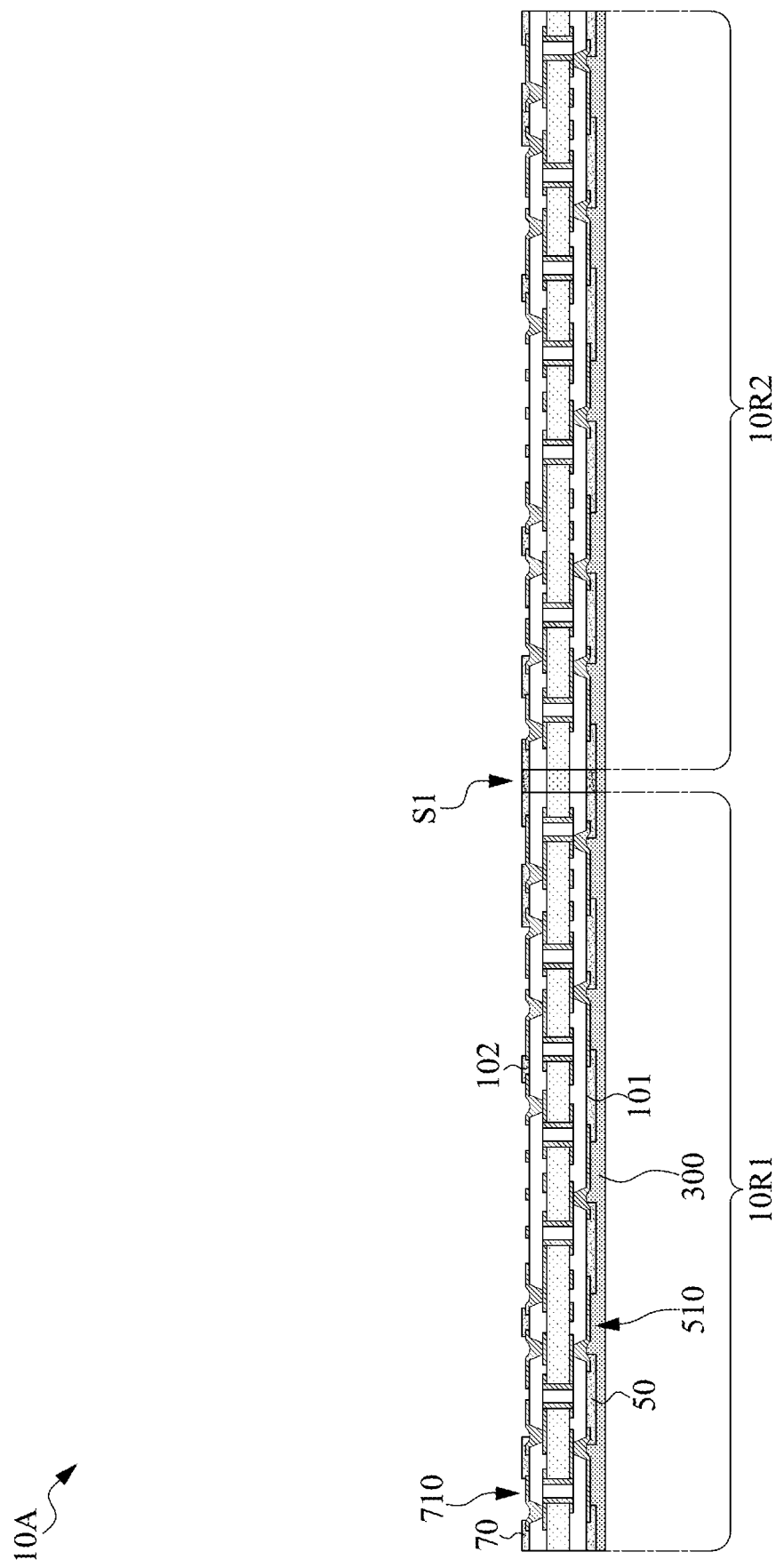
Figure 6C:
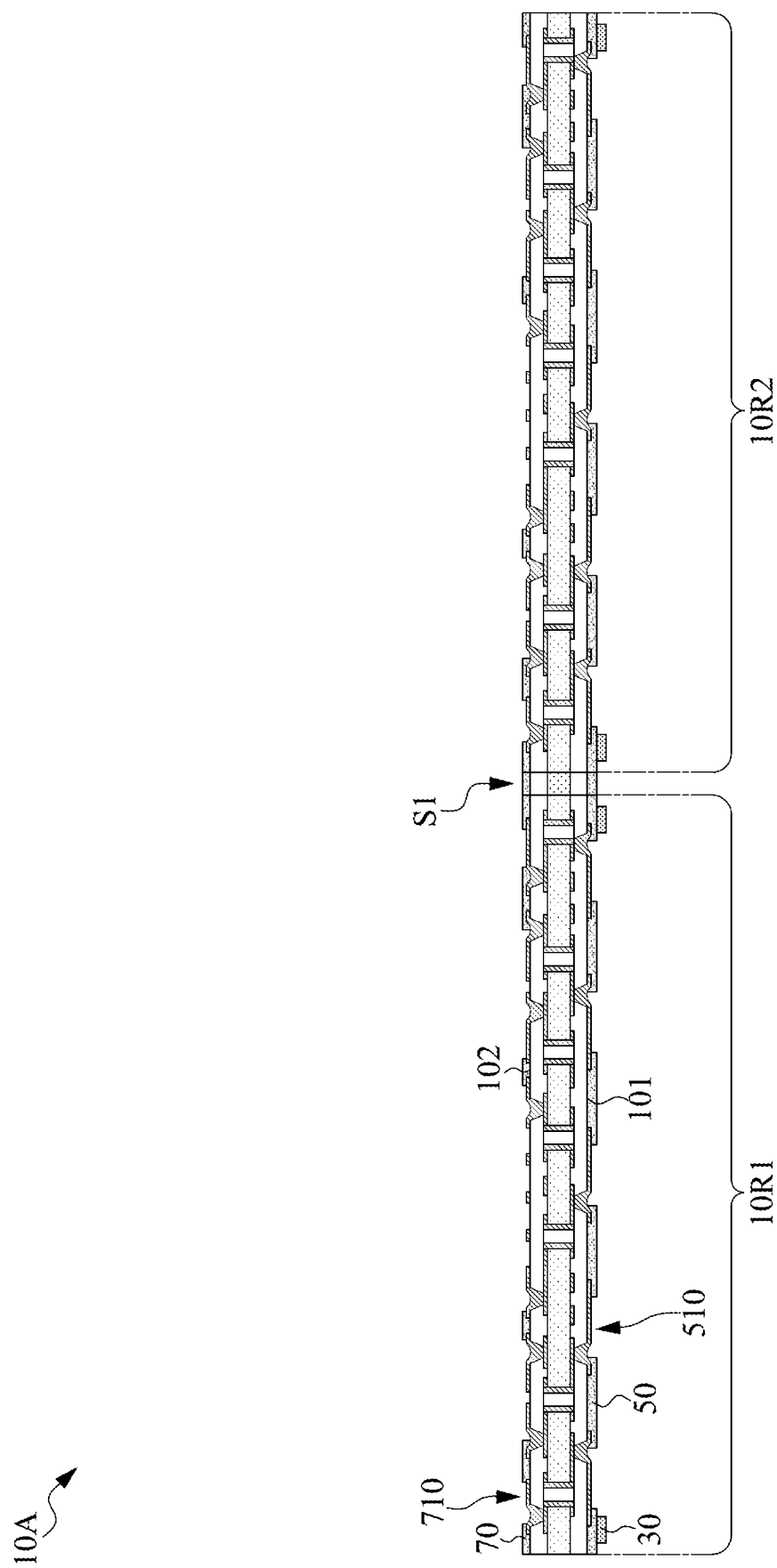

FIG. 6A, FIG. 6B, and FIG. 6C illustrate various operations in a method of manufacturing an electronic package structure 2 in accordance with some embodiments of the present disclosure.

Referring to FIG. 6A, a protection layer 50 may be formed on the surface 101 of the substrate layer 10A. In some embodiments, operations similar to those illustrated in FIGS. 5A-5C for forming the protection layer 70 are performed to form the protection layer 50 on the surface 101 of the substrate layer 10A. In some embodiments, operations similar to those illustrated in FIGS. 5A-5C for forming the protection layer 70 are performed to form a protection layer 70 on the surface 102 of the substrate layer 10A. In some embodiments, a portion of the surface 101 of the substrate layer 10A corresponding to the predetermined cutting line region S1 is covered by the protection layer 50. In some embodiments, a portion of the surface 102 of the substrate layer 10A corresponding to the predetermined cutting line region S1 is covered by the protection layer 70.

Referring to FIG. 6B, an insulating layer 300 may be formed on the protection layer 50. In some embodiments, the insulating layer 300 is filled in the openings 510 of the protection layer 50.

Referring to FIG. 6C, a portion of the insulating layer 300 may be removed to expose a portion of the protection layer 50 to form the support structure 30. In some embodiments, the openings 510 of the protection layer 50 are exposed from the support structure 30. In some embodiments, the protection layer 50 is formed prior to forming the support structure 30. In some embodiments, a portion of the protection layer 50 corresponding to the predetermined cutting line region S1 is exposed from the support structure 30.

Next, operations similar to those illustrated in FIG. 5D may be performed to dispose electronic components 51 and 52 over the surface 102 of the substrate layer 10A, dispose an encapsulant 60 over the surface 102 of the substrate layer 10A to encapsulate the electronic components 51 and 52, dispose electrical contacts 40 on the surface 101 of the substrate layer 10A, and perform a singulation operation along the predetermined cutting line region S1. Next, operations similar to those illustrated in FIGS. 5E-5G may be performed to form a conductive element 20 on the surfaces 602 and 603 of the encapsulant 60 and the lateral surface 103 of the substrate 10. As such, the electronic package structure 2 illustrated in FIG. 3 is formed.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of said numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" or "about" the same if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Two surfaces can be deemed to be coplanar or substantially coplanar if a displacement between the two surfaces is no greater than 5 µm, no greater than 2 µm, no greater than 1 µm, or no greater than 0.5 µm.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately 104 S/m, such as at least 105 S/m or at least 106 S/m. The electrical conductivity of a material can sometimes vary with temperature. Unless otherwise specified, the electrical conductivity of a material is measured at room temperature.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component.

While the present disclosure has been described and illustrated with reference to specific embodiments thereof, these descriptions and illustrations do not limit the present disclosure. It can be clearly understood by those skilled in the art that various changes may be made, and equivalent components may be substituted within the embodiments without departing from the true spirit and scope of the present disclosure as defined by the appended claims. The illustrations may not necessarily be drawn to scale. There may be distinctions between the artistic renditions in the present disclosure and the actual apparatus, due to variables in manufacturing processes and the like. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it can be understood that these operations may be combined, sub-divided, or re-ordered to form an equivalent method without departing from the teachings of the present disclosure. Therefore, unless specifically indicated herein, the order and grouping of the operations are not limitations of the present disclosure.

What is claimed is:

1. An electronic package structure, comprising:
   a substrate having a bottom surface and a lateral surface adjacent to the bottom surface;
   a conductive element on the lateral surface of the substrate; and
   a support structure disposed under the bottom surface of the substrate and configured to space the bottom surface from an external carrier, wherein a lateral surface of the support structure is spaced apart from the lateral surface of the substrate by a first distance;
   wherein the conductive element is further disposed on a portion of the bottom surface of the substrate defined by the first distance; and
   wherein the conductive element comprises a first portion on the lateral surface of the substrate and a second portion on the bottom surface of the substrate, and a thickness of the second portion of the conductive element is less than a thickness of the first portion of the conductive element.

2. The electronic package structure of claim 1, wherein the lateral surface of the support structure is indented from the lateral surface of the substrate by the first distance.

3. The electronic package structure of claim 1, wherein a part of the portion of the bottom surface of the substrate is exposed from a space between the lateral surface of the support structure and the second portion of the conductive element.

4. The electronic package structure of claim 3, wherein the substrate further has an upper surface opposite to the bottom surface, and a thickness of the support structure is greater than a thickness of a third portion of the conductive element over the upper surface of the substrate.

5. The electronic package structure of claim 1, wherein the lateral surface of the support structure and the conductive element collectively define a recess.

6. The electronic package structure of claim 5, further comprising an electrical contact disposed under the bottom surface of the substrate, wherein the recess is spaced apart from the electrical contact.

7. The electronic package structure of claim 1, further comprising a plurality of electrical contacts disposed on the bottom surface of the substrate, wherein a first pitch of a first group of the electrical contacts is different from a second pitch of a second group of the electrical contacts.

8. An electronic package structure, comprising:
   a substrate having a bottom surface and a lateral surface non-parallel with the bottom surface; and
   a spacing element adjacent to the bottom surface of the substrate and providing a predetermined gap configured to space the bottom surface from an external carrier to prevent continuously disposing a shielding layer between the lateral surface and the external carrier, wherein the spacing element includes at least one portion of a solder mask.

9. The electronic package structure of claim 8, further comprising:
   a conductive element disposed on the lateral surface of the substrate.

10. The electronic package structure of claim 8, wherein the spacing element is indented from the lateral surface of the substrate by a first distance.

11. The electronic package structure of claim 9, wherein a portion of the bottom surface of the substrate is exposed from a space between a lateral surface of the spacing element and the conductive element.

12. The electronic package structure of claim 9, wherein the conductive element comprises a first portion on the lateral surface of the substrate and a second portion disposed under the bottom surface of the substrate.

* * * * *